United States Patent
Kamikawa et al.

(10) Patent No.: US 8,664,688 B2
(45) Date of Patent: *Mar. 4, 2014

(54) NITRIDE SEMICONDUCTOR LIGHT-EMITTING CHIP, METHOD OF MANUFACTURE THEREOF, AND SEMICONDUCTOR OPTICAL DEVICE

(75) Inventors: Takeshi Kamikawa, Osaka (JP); Masataka Ohta, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 780 days.

This patent is subject to a terminal disclaimer.

(21) Appl. No.: 12/659,911

(22) Filed: Mar. 25, 2010

(65) Prior Publication Data

US 2010/0243988 A1 Sep. 30, 2010

(30) Foreign Application Priority Data

Mar. 27, 2009 (JP) .................................. 2009-079943

(51) Int. Cl.
*H01L 33/00* (2010.01)

(52) U.S. Cl.
USPC ................ 257/103; 257/94; 257/615; 438/46

(58) Field of Classification Search
None
See application file for complete search history.

(56) References Cited

U.S. PATENT DOCUMENTS

| | | | |
|---|---|---|---|
| 6,072,197 A | 6/2000 | Horino et al. | |
| 6,576,932 B2 | 6/2003 | Khare et al. | |
| 7,012,283 B2 | 3/2006 | Tsuda et al. | |
| 7,498,608 B2 | 3/2009 | Ito et al. | |
| 7,847,280 B2 | 12/2010 | Yamada et al. | |
| 8,344,413 B2 * | 1/2013 | Kamikawa et al. | 257/99 |
| 2002/0050596 A1 | 5/2002 | Otsuka et al. | |
| 2003/0165169 A1 | 9/2003 | Nomoto et al. | |
| 2005/0025204 A1 | 2/2005 | Kamikawa et al. | |
| 2005/0151153 A1 * | 7/2005 | Kamikawa et al. | 257/103 |
| 2005/0232327 A1 | 10/2005 | Nomura et al. | |
| 2006/0094244 A1 | 5/2006 | Yamada et al. | |
| 2006/0131590 A1 | 6/2006 | Takakura et al. | |
| 2006/0187989 A1 | 8/2006 | Tanaka | |
| 2007/0051961 A1 | 3/2007 | Kamikawa et al. | |

(Continued)

FOREIGN PATENT DOCUMENTS

| | | |
|---|---|---|
| CN | 1770578 | 5/2006 |
| CN | 1983751 | 6/2007 |

(Continued)

OTHER PUBLICATIONS

S.T. Kim, et al., "Properties of c-axis oriented Freestanding GaN Substrates Prepared on Fused Silica Glass by Hydride Vapor Phase Epitaxy", Journal of the Korean Physical Society, vol. 32, No. 1, Jan. 1997, pp L1-L3.

*Primary Examiner* — Andres Munoz
(74) *Attorney, Agent, or Firm* — Harness, Dickey & Pierce, P.L.C.

(57) ABSTRACT

A nitride semiconductor light-emitting chip offers enhanced luminous efficacy as a result of an improved EL emission pattern. The nitride semiconductor laser chip (nitride semiconductor light-emitting chip) has a nitride semiconductor substrate having a principal growth plane, and nitride semiconductor layers grown on the principal growth plane of the nitride semiconductor substrate. The principal growth plane of the GaN substrate is a plane having off-angles in both the a- and c-axis directions relative to an m plane, and the off-angle in the a-axis direction is larger than the off-angle in the c-axis direction.

13 Claims, 12 Drawing Sheets

(56) References Cited

U.S. PATENT DOCUMENTS

| | | | |
|---|---|---|---|
| 2007/0121692 A1 | 5/2007 | Kawakami et al. | |
| 2007/0221932 A1 | 9/2007 | Kano et al. | |
| 2008/0112448 A1 | 5/2008 | Ueda et al. | |
| 2008/0272462 A1 | 11/2008 | Shimamoto et al. | |
| 2008/0283851 A1* | 11/2008 | Akita | 257/94 |
| 2008/0285609 A1 | 11/2008 | Ohta et al. | |
| 2008/0304528 A1 | 12/2008 | Yamamoto et al. | |
| 2008/0308815 A1 | 12/2008 | Kasai et al. | |
| 2008/0308906 A1 | 12/2008 | Osada et al. | |
| 2009/0092166 A1 | 4/2009 | Kamikawa et al. | |
| 2009/0095973 A1 | 4/2009 | Tanaka et al. | |
| 2009/0161711 A1 | 6/2009 | Kubota | |
| 2009/0200573 A1 | 8/2009 | Kawakami et al. | |
| 2009/0262771 A1 | 10/2009 | Inoue et al. | |
| 2009/0309135 A1 | 12/2009 | Udagawa | |
| 2009/0323750 A1 | 12/2009 | Inoue et al. | |
| 2010/0032644 A1 | 2/2010 | Akita et al. | |
| 2010/0046566 A1 | 2/2010 | Kudo | |
| 2010/0117055 A1 | 5/2010 | Nakanishi et al. | |
| 2010/0133506 A1 | 6/2010 | Nakanishi et al. | |
| 2010/0220761 A1 | 9/2010 | Enya et al. | |
| 2010/0244087 A1* | 9/2010 | Horie et al. | 257/103 |
| 2010/0246624 A1 | 9/2010 | Hiroyama et al. | |
| 2010/0295054 A1 | 11/2010 | Okamoto et al. | |

FOREIGN PATENT DOCUMENTS

| | | | | |
|---|---|---|---|---|
| CN | 101308896 | 11/2008 | | |
| JP | 10-135576 | 5/1998 | | |
| JP | 11-150321 | 6/1999 | | |
| JP | 2000-277846 | 10/2000 | | |
| JP | 2003-031894 | 1/2003 | | |
| JP | 2003-258370 | 9/2003 | | |
| JP | 2004-311964 | 11/2004 | | |
| JP | 2004-356454 | 12/2004 | | |
| JP | 2004-363401 | 12/2004 | | |
| JP | 2005-064204 | 3/2005 | | |
| JP | 2005-64469 | 3/2005 | | |
| JP | 2005-294322 | 10/2005 | | |
| JP | 2006-093548 | 4/2006 | | |
| JP | 2006-134926 | 5/2006 | | |
| JP | 2006-156953 | 6/2006 | | |
| JP | 2006-190980 | 7/2006 | | |
| JP | 2006-303471 | 11/2006 | | |
| JP | 2007-088270 | 4/2007 | | |
| JP | 2007-096200 | 4/2007 | | |
| JP | 2007-184503 | 7/2007 | | |
| JP | 2008-016584 | 1/2008 | | |
| JP | 2008-091488 | 4/2008 | | |
| JP | 2008-118049 | 5/2008 | | |
| JP | 2008-226865 | 9/2008 | | |
| JP | 2008-277539 | 11/2008 | | |
| JP | 2008-285364 | 11/2008 | | |
| JP | 2008-306062 | 12/2008 | | |
| JP | 2008-311640 | 12/2008 | | |
| JP | 2009-018983 | 1/2009 | | |
| JP | 2009-094360 | 4/2009 | | |
| JP | 2009-117662 | 5/2009 | | |
| JP | 2009-141132 | 6/2009 | | |
| JP | 2009-152502 | 7/2009 | | |
| JP | 2009-152511 | 7/2009 | | |
| JP | 2009-158955 | 7/2009 | | |
| JP | 2009239250 A * | 10/2009 | | H01L 21/205 |
| JP | 2010-123803 | 6/2010 | | |
| JP | 2010-205835 | 9/2010 | | |
| JP | 2010-219140 | 9/2010 | | |
| WO | WO 2006/054543 | 5/2006 | | |
| WO | WO 2008/126695 | 10/2008 | | |
| WO | WO 2008/153130 | 12/2008 | | |
| WO | WO 2008/155958 | 12/2008 | | |
| WO | WO 2009066466 A1 * | 5/2009 | | H01L 21/205 |

* cited by examiner

NITRIDE SEMICONDUCTOR LIGHT-EMITTING CHIP, METHOD OF MANUFACTURE THEREOF, AND SEMICONDUCTOR OPTICAL DEVICE

This nonprovisional application claims priority under 35 U.S.C. §119(a) on Patent Application No. 2009-079943 filed in Japan on Mar. 27, 2009, the entire contents of which are hereby incorporated by reference.

BACKGROUND OF THE INVENTION

1. Field of the Invention

The present invention relates to a nitride semiconductor light-emitting chip, to a method of manufacture thereof, and to a semiconductor optical device. More particularly, the present invention relates to a nitride semiconductor light-emitting chip provided with a nitride semiconductor substrate, to a method of manufacture thereof, and the a semiconductor optical device incorporating such a nitride semiconductor light-emitting chip.

2. Description of Related Art

Nitride semiconductors as exemplified by GaN, AlN, InN, and their mixed crystals are characterized by having wider band gaps Eg than AlGaInAs- and AlGaInP-based semiconductors and in addition being direct band gap materials. For these reasons, nitride semiconductors have been receiving attention as materials for building semiconductor light-emitting chips such as semiconductor laser chips emitting light in wavelength regions from ultraviolet to green and light-emitting diode chips covering wide emission wavelength ranges from ultraviolet to red, and are expected to find wide application in projectors and full-color displays, and further in environmental, medical, and other fields.

On the other hand, in recent years, many research institutions have been making vigorous attempts to realize semiconductor light-emitting chips emitting light in a green region (green semiconductor lasers) by making longer the emission wavelengths of semiconductor light-emitting chips using nitride semiconductors.

Generally, in a semiconductor light-emitting chip using a nitride semiconductor, a substrate (nitride semiconductor substrate) of GaN, which has a hexagonal crystal system, is used, and its c plane (the (0001) plane) is used as the principal growth plane. By stacking nitride semiconductor layers including an active layer on the c plane, a nitride semiconductor light-emitting chip is formed. Generally, in a case where a nitride semiconductor light-emitting chip is formed by use of a nitride semiconductor substrate, an active layer containing In is used, and by increasing the In composition ratio, a longer emission wavelength is sought.

Inconveniently, however, the c plane of a GaN substrate is a polar plane having polarity in the c-axis direction, and therefore stacking nitride semiconductor layers including an active layer on the c plane causes spontaneous polarization in the active layer. Also inconveniently, when nitride semiconductor layers including an active layer are stacked on the c plane, as the In composition ratio increases, lattice distortion increases, inducing in the active layer a strong internal electric field due to piezoelectric polarization. The internal electric field reduces the overlap between the wave functions of electrons and holes, and thus diminishes the rate of radiative recombination. Accordingly, increasing the In composition ratio in an attempt to realize light emission in a green region suffers from the problem that, as the emission wavelength is lengthened, luminous efficacy significantly lowers.

To avoid the effects of spontaneous polarization and piezoelectric polarization, therefore, there are nowadays proposed nitride semiconductor light-emitting chips having nitride semiconductor layers stacked not on the c plane as commonly practiced but on the m plane (the {1–100} plane), which is a non-polar plane. Such nitride semiconductor light-emitting chips are disclosed, for example, in JP-A-2008-91488.

The nitride semiconductor light-emitting chip (light-emitting diode chip) disclosed in JP-A-2008-91488 mentioned above is provided with a GaN substrate of which the m plane, which is a non-polar plane, is used as the principal growth plane, and on this principal growth plane (the m plane), nitride semiconductor layers including an active layer are stacked. The m plane is a crystal plane perpendicular to the c plane, and therefore stacking nitride semiconductor layers including an active layer on the m plane causes the c axis, which is an axis of polarization, to lie on the plane of the active layer. Thus, the effects of spontaneous polarization and piezoelectric polarization are avoided, and the lowering of luminous efficacy is suppressed. Incidentally, in the nitride semiconductor light-emitting chip (light-emitting diode chip) disclosed in JP-A-2008-91488, from the viewpoint of suppressing deterioration of surface morphology, the m plane of the GaN substrate is so adjusted that its off-angle (alignment error) is not more than ±1 degree.

As described above, by use of a nitride semiconductor substrate having the m plane as the principal growth plane, it is possible to obtain a nitride semiconductor light-emitting chip in which the lowering of luminous efficacy due to spontaneous polarization and piezoelectric polarization is suppressed.

Inconveniently, however, through measurements of luminous efficacy (of light emission resulting from current injection, that is, electroluminescence, abbreviated to EL) with regard to nitride semiconductor light-emitting chips using a nitride semiconductor substrate having the m plane as the principal growth plane, it was confirmed that, as the In composition ratio in the active layer increased, the luminous efficacy sharply lowered. Through intensive studies in search of the cause of the phenomenon, the inventors of the present invention have found out that the lowering of luminous efficacy is caused by the EL emission pattern (the light distribution across the plane as observed when light is emitted by current injection) becoming bright-spotted. That is, the inventors have found out that, as the In composition ratio in the active layer increases, the EL emission pattern of nitride semiconductor light-emitting chips become bright-spotted.

Specifically, when nitride semiconductor light-emitting chips (light-emitting diode chips) using a nitride semiconductor substrate having the m plane as the principal growth plane were fabricated and were made to emit light by current injection, a bright-spotted EL emission pattern as shown in FIG. 24 was observed. What conditions cause this phenomenon have not conventionally been known at all. Through close studies in search for the cause, it has been found out that, as the In composition ratio in the active layer increases, the EL emission pattern becomes increasingly bright-spotted. Such a bright-spotted EL emission pattern becomes more prominent as the In composition ratio in the active layer increases, and a tendency has been observed that a bright-spotted EL emission pattern is especially prominent starting around a green region (with the In composition ratio in the active layer (well layer) 0.15 or more). As the In content increases further, the number of light-emitting bright spots (the area of light emission) decreases. Thus, a strong correlation is observed between the bright-spotted EL emission pattern and the In composition ratio, and it has therefore been found out that the phenomenon of the EL emission pattern becoming bright-spotted causes the lowering of luminous efficacy that occurs with increased In composition ratios in the active layer. Used as the nitride semiconductor substrate in the studies was a just substrate with an off-angle of 0 degrees (that is, a substrate with no off-angle).

The bright-spotted EL emission pattern described above is a phenomenon prominent in nitride semiconductor light-emitting chips (light-emitting diode chips) using a nitride semiconductor substrate having a non-polar plane, in particular the m plane, as the principal growth plane.

As discussed above, it has been found out that, in nitride semiconductor light-emitting chips using a nitride semiconductor substrate having the m plane as the principal growth plane, as distinct from nitride semiconductor light-emitting chips using the c plane, the lowering of luminous efficacy due to spontaneous polarization and piezoelectric polarization is suppressed, but there is the problem of lower luminous efficacy due to a bright-spotted EL emission pattern. In nitride semiconductor light-emitting chips using the m plane, such a bright-spotted EL emission pattern poses a great problem because it hampers the lengthening of the emission wavelength. In particular, in semiconductor laser chips, low luminous efficacy is a serious problem because it leads to low gain.

SUMMARY OF THE INVENTION

The present invention has been devised to overcome the problems mentioned above, and it is an object of the present invention to provide a nitride semiconductor light-emitting chip that offers enhanced luminous efficacy as a result of an improved EL emission pattern, to provide a method of manufacturing such a nitride semiconductor light-emitting chip, and to provide a semiconductor optical device provided with such a nitride semiconductor light-emitting chip.

It is another object of the present invention to provide a nitride semiconductor light-emitting chip that offers superb chip characteristics combined with high reliability, to provide a method of manufacturing such a nitride semiconductor light-emitting chip, and to provide a semiconductor optical device provided with such a nitride semiconductor light-emitting chip.

Through various experiments and intensive studies done in view of the problems mentioned above, the inventors of the present invention have found out that it is possible to suppress a bright-spotted EL emission pattern by using as the principal growth plane of a nitride semiconductor substrate a plane having an off-angle relative to the m plane.

Specifically, according to a first aspect of the present invention, a nitride semiconductor light-emitting chip is provided with: a nitride semiconductor substrate having a principal growth plane; and a nitride semiconductor layer grown on the principal growth plane of the nitride semiconductor substrate. Here, the principal growth plane is a plane having off-angles in both the a- and c-axis directions relative to the m plane, and the off-angle in the a-axis direction is larger than the off-angle in the c-axis direction.

With the nitride semiconductor light-emitting chip according to the first aspect, by using as the principal growth plane of the nitride semiconductor substrate a plane having an off-angle in the a-axis direction relative to the m plane as described above, it is possible to suppress a bright-spotted EL emission pattern. That is, with this structure, it is possible to improve the EL emission pattern of the nitride semiconductor light-emitting chip. This helps enhance the luminous efficacy of the nitride semiconductor light-emitting chip. Enhancing luminous efficacy helps obtain a high-luminance nitride semiconductor light-emitting chip. One reason that an effect of suppressing bright-spotted emission as described above is obtained is considered to be that giving the principal growth plane of the nitride semiconductor substrate an off-angle in the a-axis direction relative to the m plane causes the direction of migration of atoms to change when the nitride semiconductor layer is grown on the principal growth plane.

Moreover, according to the first aspect, by giving the principal growth plane of the nitride semiconductor substrate an off-angle in the a-axis direction larger than the off-angle in the c-axis direction, it is possible to suppress a bright-spotted EL emission pattern effectively. That is, with that structure, it is possible to suppress the inconvenience of the effect of suppressing bright-spotted emission being diminished due to too large an off-angle in the c-axis direction. Thus, it is possible to enhance luminous efficacy easily.

Moreover, according to the first aspect, by suppressing a bright-spotted EL emission pattern, it is possible to make the EL emission pattern even, and thus to reduce the driving voltage. Since suppressing bright-spotted emission helps obtain an even EL emission pattern, it is possible to increase gain in the formation of a nitride semiconductor laser chip.

Furthermore, according to the first aspect, since the structure described above helps suppress a bright-spotted EL emission pattern, it is possible to enhance luminous efficacy. This helps enhance chip characteristics and reliability. That is, it is possible to obtain a nitride semiconductor light-emitting chip with superb chip characteristics and high reliability.

In the nitride semiconductor light-emitting chip according to the first aspect described above, preferably, the off-angle in the a-axis direction and the off-angle in the c-axis direction are each larger than ±0.1 degrees. With this structure, it is possible to suppress a bright-spotted EL emission pattern easily. Incidentally, making the off-angle in the a-axis direction larger than ±0.1 degrees helps suppress the inconvenience of the surface morphology deteriorating due to the off-angle in the a-axis direction being equal to or smaller than ±0.1 degrees. On the other hand, making the off-angle in the c-axis direction larger than ±0.1 degrees helps suppress the inconvenience of the thickness of the nitride semiconductor layer grown on the principal growth plane becoming uneven due to the off-angle in the c-axis direction being smaller than ±0.1 degrees.

In the nitride semiconductor light-emitting chip according to the first aspect described above, preferably, the off-angle in the a-axis direction is larger than 0.1 degrees but 10 degrees or smaller. With this structure, it is possible to suppress the inconvenience of surface morphology deteriorating due to the off-angle in the a-axis direction being larger than 10 degrees. That is, with the structure described above, it is possible, while obtaining satisfactory surface morphology, to suppress a bright-spotted EL emission pattern easily.

In this case, it is preferable that the off-angle in the a-axis direction be larger than 1 degree but 10 degrees or smaller. With this structure, it is possible, while obtaining satisfactory surface morphology, to suppress a bright-spotted EL emission pattern more easily. Setting the off-angle in the a-axis direction in that way is more preferable because it is then possible to obtain a marked effect of reducing the driving voltage and in addition an effect of improving surface morphology. Moreover, by setting the off-angle in the a-axis direction in that way, it is possible to effectively suppress the development of a pyramid-shaped elevated portion which may develop on the layer surface when the nitride semiconductor layer is grown on the m plane.

In the nitride semiconductor light-emitting chip according to the first aspect described above, preferably, the nitride semiconductor layer includes an active layer having a quantum well structure, and the active layer has one well layer. Also with this structure, it is possible to obtain the effect of suppressing bright-spotted emission, and to reduce the driving voltage easily. Thus, also with this structure, it is possible to enhance chip characteristics and reliability. Moreover, with this structure, it is possible to obtain higher luminous efficacy than with a structure in which the active layer is so formed as to include three or more well layers. Thus, it is possible to obtain a high-luminance nitride semiconductor light-emitting chip easily.

In the nitride semiconductor light-emitting chip according to the first aspect described above, the nitride semiconductor layer may include an active layer having a quantum well structure, and the active layer may have two well layers. Also with this structure, it is possible to obtain the effect of suppressing bright-spotted emission, and to reduce the driving voltage easily. Moreover, with this structure, it is possible to obtain higher luminous efficacy than with a structure in which the active layer is so formed as to include three or more well layers.

In the nitride semiconductor light-emitting chip according to the first aspect described above, preferably, the nitride semiconductor layer includes an active layer having a quantum well structure, the active layer has a well layer formed of a nitride semiconductor containing In, and the In composition ratio in the well layer is 0.15 or more but 0.45 or less. By applying this structure to the nitride semiconductor light-emitting chip according to the first aspect described above, even with the In composition ratio in the well layers 0.15 or more, that is, even under conditions where a bright-spotted EL emission pattern is prominent, it is possible to effectively suppress a bright-spotted EL emission pattern. Thus, it is possible to obtain a prominent effect of suppressing a bright-spotted EL emission pattern. It is also possible to suppress the inconvenience of a large number of dislocations developing in the active layer as a result of strain such as a lattice mismatch due to the In composition ratio in the active layer being more than 0.45.

In the nitride semiconductor light-emitting chip according to the first aspect described above, it is preferable that the nitride semiconductor substrate be formed of GaN.

According to a second aspect of the present invention, a method of manufacture of a nitride semiconductor light-emitting chip includes: a step of preparing a nitride semiconductor substrate having as a principal growth plane a plane having off-angles in both the a- and c-axis directions relative to the m plane, the off-angle in the a-axis direction being larger than the off-angle in the c-axis direction; and a step of stacking, on the principal growth plane of the nitride semiconductor substrate, by an epitaxial growth method, a nitride semiconductor layer including an n-type semiconductor layer, an active layer, and a p-type semiconductor layer. Here, the step of stacking the nitride semiconductor layer includes a step of forming, from the nitride semiconductor substrate side, the n-type semiconductor layer, the active layer, and the p-type semiconductor layer.

In the method of manufacture of a nitride semiconductor light-emitting chip according to the second aspect, by use of a nitride semiconductor substrate having as a principal growth plane a plane having an off-angle in the a-axis direction relative to the m plane, it is possible to obtain a nitride semiconductor light-emitting chip in which a bright-spotted EL emission pattern is suppressed. That is, with this scheme, it is possible to obtain a nitride semiconductor light-emitting chip with an improved emission pattern. Thus, it is possible to obtain a high-luminance nitride semiconductor light-emitting chip with improved luminous efficacy.

Moreover, according to the second aspect, by giving the principal growth plane of the nitride semiconductor substrate an off-angle in the a-axis direction larger than the off-angle in the c-axis direction, it is possible to obtain a nitride semiconductor light-emitting chip in which a bright-spotted EL emission pattern is suppressed effectively. That is, with that scheme, it is possible to suppress the inconvenience of the effect of suppressing bright-spotted emission being diminished due to too large an off-angle in the c-axis direction. Thus, it is possible to enhance the luminous efficacy of the nitride semiconductor light-emitting chip easily.

Moreover, according to the second aspect, by suppressing a bright-spotted EL emission pattern, it is possible to make the EL emission pattern even, and thus to reduce the driving voltage of the nitride semiconductor light-emitting chip. Since suppressing bright-spotted emission helps obtain an even EL emission pattern, it is possible to increase gain in the formation of a nitride semiconductor laser chip.

Furthermore, according to the second aspect, since the above scheme helps suppress a bright-spotted EL emission pattern, it is possible to enhance luminous efficacy, and thereby to enhance chip characteristics and reliability. That is, it is possible to obtain a nitride semiconductor light-emitting chip with superb chip characteristics and reliability.

In the method of manufacture of a nitride semiconductor light-emitting chip according to the second aspect described above, preferably, the step of stacking the nitride semiconductor layer includes a step of forming the p-type semiconductor layer at a growth temperature of 700° or higher but lower than 900° C. By forming the p-type semiconductor layer at a growth temperature lower than 900° C. as described above, it is possible to reduce thermal damage to the active layer. On the other hand, by forming the p-type semiconductor layer at a growth temperature of 700° C. or higher, it is possible to suppress the inconvenience of the p-type semiconductor layer having a high resistance due to its being formed at a growth temperature lower than 700° C. Thus, this too helps enhance chip characteristics and reliability. Incidentally, by use of a nitride semiconductor substrate having a principal growth plane provided with an off-angle relative to the m plane, even when the p-type semiconductor layer is formed at a growth temperature lower than 900° C., it is possible to obtain p-type conductivity.

In the method of manufacture of a nitride semiconductor light-emitting chip according to the second aspect described above, preferably, the step of stacking the nitride semiconductor layer includes a step of forming the n-type semiconductor layer at a growth temperature of 900° or higher but lower than 1300° C. By forming the n-type semiconductor layer at a high temperature of 900° C. or higher as described above, it is possible to make the layer surface of the n-type semiconductor layer flat. Thus, by forming the active layer and the p-type semiconductor layer on the n-type semiconductor layer thus made flat, it is possible to suppress degradation of crystallinity in the active layer and the p-type semiconductor layer. This too makes it possible to form a high-quality crystal. On the other hand, by forming the n-type semiconductor layer at a growth temperature lower than 1300° C., it is possible to suppress the inconvenience of the surface of the nitride semiconductor substrate re-evaporating and becoming rough during the raising of temperature due to the n-type semiconductor layer being formed at a growth temperature of 1300° C. or higher. Thus, with this scheme, it is possible to manufacture a nitride semiconductor light-emitting chip with superb chip characteristics and high reliability easily.

In the method of manufacture of a nitride semiconductor light-emitting chip according to the second aspect described above, preferably, the step of stacking the nitride semiconductor layer includes a step of forming the active layer at a growth temperature of 600° or higher but 770° C. or lower. By forming the active layer at a growth temperature of 770° C. or lower as described above, it is possible to suppress the inconvenience of the active layer being blackened by thermal damage due to the active layer being formed at a growth temperature higher than 770° C. (for example, 830° C. or higher). On the other hand, by forming the active layer at a growth temperature of 600° C. or higher, it is possible to suppress the inconvenience of a shorter atom diffusion length and hence degraded crystallinity due to the active layer being formed at a growth temperature lower than 600° C. Thus, with this scheme, it is possible to manufacture a nitride semiconductor light-emitting chip with superb chip characteristics and high reliability more easily.

According to a third aspect of the present invention, a semiconductor optical device is provided with the nitride semiconductor light-emitting chip according to the first aspect described above.

As described above, according to the present invention, it is possible to easily obtain a nitride semiconductor light-emitting chip that offers enhanced luminous efficacy as a result of an improved EL emission pattern, to provide a method of manufacturing such a nitride semiconductor light-emitting chip, and to provide a semiconductor optical device provided with such a nitride semiconductor light-emitting chip.

Moreover, according to the present invention, it is possible to easily obtain a nitride semiconductor light-emitting chip that offers superb chip characteristics combined with high reliability, to provide a method of manufacturing such a nitride semiconductor light-emitting chip, and to provide a semiconductor optical device provided with such a nitride semiconductor light-emitting chip.

DETAILED DESCRIPTION OF PREFERRED AN EMBODIMENT

Hereinafter, an embodiment of the present invention will be described in detail with reference to the accompanying drawings. The embodiment described below deals with cases where the present invention is applied to nitride semiconductor laser chips as an example of nitride semiconductor light-emitting chips. In the following embodiment, a "nitride semiconductor" denotes a semiconductor of the composition $Al_xGa_yIn_zN$ (where $0 \leq x \leq 1$, $0 \leq y \leq 1$, $0 < z \leq 1$, and $x+y+z=1$).

First, with reference to FIGS. 1 to 6, the structure of a nitride semiconductor laser chip 100 according to one embodiment of the invention will be described.

Figure 1:
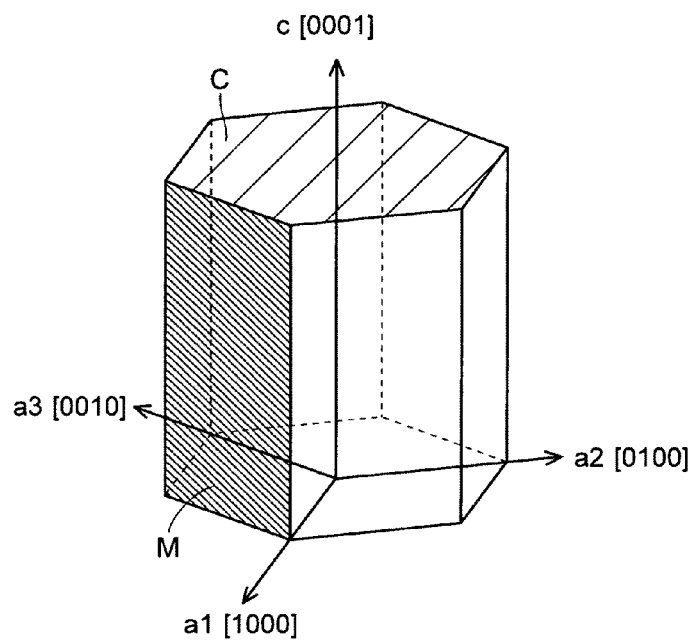
FIG. 1 is a schematic diagram illustrating the crystal structure of a nitride semiconductor (a diagram showing a unit cell)

The nitride semiconductor laser chip 100 according to one embodiment is formed of a nitride semiconductor having a crystal structure of a hexagonal crystal system as shown in FIG. 1. In this crystal structure, when the hexagonal crystal system is considered a hexagonal column about a c axis [0001], the plane (the top face C of the hexagonal column) to which the c axis is normal is called the c plane (0001), and any of the side wall faces M of the hexagonal column is called the m plane {1–100}. In a nitride semiconductor, no plane of symmetry exists in the c-axis direction, and therefore a direction of polarization runs along the c-axis direction. Thus, the c plane exhibits different properties between the +c axis side and the −c axis side. Specifically, the +c plane (the (0001) plane, a Ga polar plane G) and the −c plane (the (000–1) plane, a N polar plane N) are not equivalent planes, and have different chemical properties. On the other hand, the m plane is a crystal plane perpendicular to the c plane, and therefore a normal to the m plane is perpendicular to the direction of polarization. Thus, the m plane is a non-polar plane, that is, a plane having no polarity. Since, as described above, the side wall faces of the hexagonal column are each the m plane, the m plane can be represented by six plane orientations, namely (1–100), (10–10), (01–10), (−1100), (−1010), and (0–110); these plane orientations are equivalent in terms of crystal geometry, and are therefore collectively represented by {1–100}.

Figure 2:
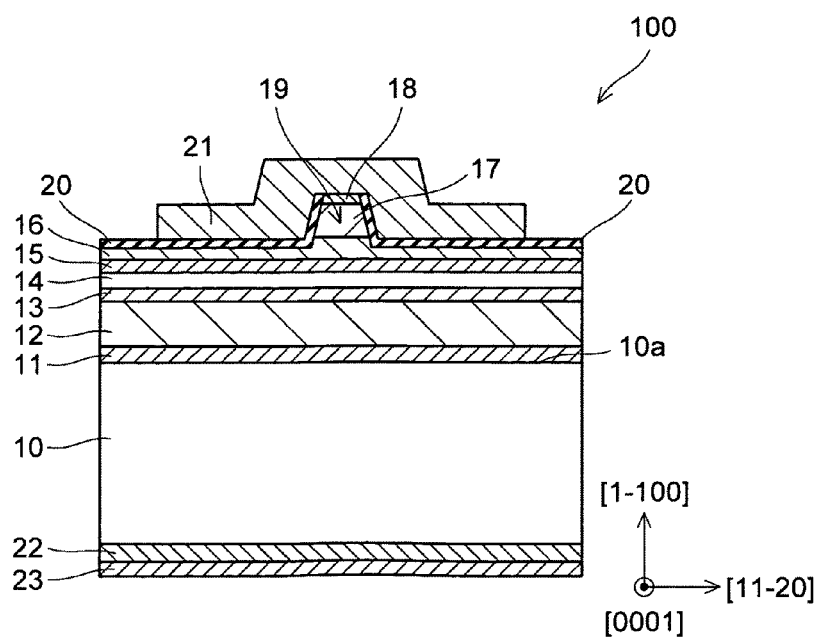
FIG. 2 is a sectional view showing the structure of a nitride semiconductor laser chip according to one embodiment of the invention (a diagram corresponding a section along line A-A in FIG. 6)
Figure 3:
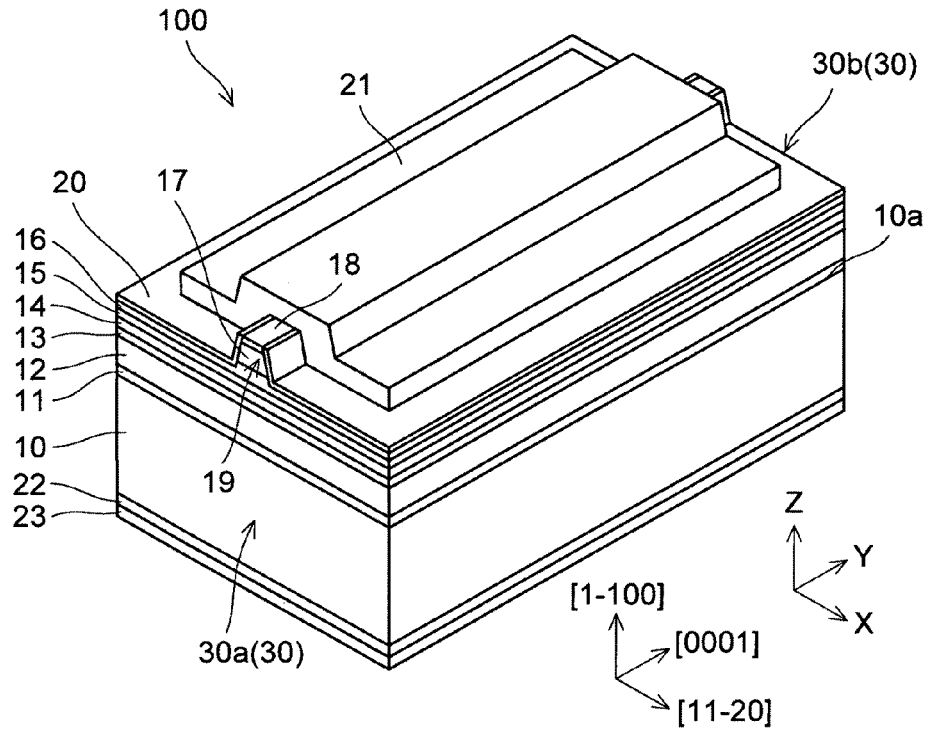
FIG. 3 is an overall perspective view of a nitride semiconductor laser chip according to one embodiment of the invention.

As shown in FIGS. 2 and 3, the nitride semiconductor laser chip 100 according to one embodiment is provided with a GaN substrate 10 as a nitride semiconductor substrate. The principal growth plane 10a of this GaN substrate 10 is a plane having an off-angle relative to the m plane. Specifically, the GaN substrate 10 of the nitride semiconductor laser chip 100 has, relative to the m plane, an off-angle in the a-axis direction (the [11–20] direction) and also an off-angle in the c-axis direction (the [0001] direction). That is, according to one embodiment, the principal growth plane 10a of the GaN substrate 10 is a plane having off-angles in both the a- and c-axis directions.

Figure 4:
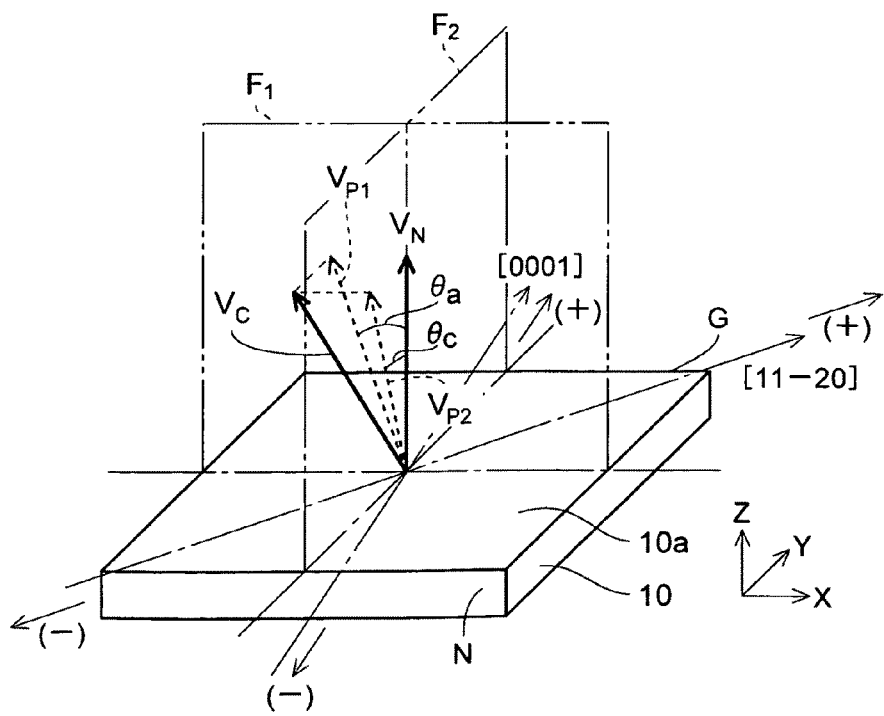
FIG. 4 is a schematic diagram illustrating off-angles of a substrate.

Now, with reference to FIG. 4, the off-angle of the GaN substrate 10 will be described in more detail. First, with respect to the m plane, two crystal axis directions are defined, namely the a axis [11–20] direction and the c axis [0001] direction. These axes, namely the a and c axes, are perpendicular to each other, and in addition are both perpendicular to the m axis. Moreover, the directions that are parallel to the a-, c-, and m-axis directions when the crystal axis vector (the m axis [1–100]) $V_C$ of the GaN substrate 10 coincides with the normal vector $V_N$ of the substrate surface (the principal growth plane 10a) (that is, when the off-angle is 0 in all directions) are taken as the X, Y, and Z directions respectively. Next, a first plane $F_1$ a normal to which runs in the Y direction and a second plane $F_2$ a normal to which runs in the X direction are considered. Then, the crystal axis vector $V_C$ that appears when the crystal axis vector $V_C$ is projected on the first and second planes $F_1$ and $F_2$ are taken as a first and a second projected vector $V_{P1}$ and $V_{P2}$ respectively. Here, the angle θa between the first projected vector $V_{P1}$ and the normal vector $V_N$ is the off-angle in the a-axis direction, and the angle θc between the second projected vector $V_{P2}$ and the normal vector $V_N$ is the off-angle in the c-axis direction. An off-angle in the a-axis direction, irrespective of whether it is in the + or − direction, indicates the same surface status from a crystallographic point of view, and thus behaves in the same manner in the + and − directions; this permits an off-angle in a-axis direction to be given in terms of an absolute value. On the other hand, an off-angle in the c-axis direction makes either the Ga polar plane G or the N polar plane N stronger depending on whether it is in the + or − direction, and thus has different effect depending on the direction; therefore, an off-angle in the c-axis direction is given with a distinction made between the + and − directions.

As described above, according to this embodiment, the principal growth plane 10a of the GaN substrate 10 is a plane inclined in both the a- and c-axis directions relative to the m plane {1–100}.

Here, in this embodiment, the GaN substrate 10 has the off-angles in the a- and c-axis directions each adjusted to be larger than ±0.1 degrees. Moreover, the GaN substrate 10 has the off-angle in the a-axis direction adjusted to be larger than the off-angle in the c-axis direction. Furthermore, to suppress deterioration of surface morphology, the GaN substrate 10 has the off-angle in the a-axis direction adjusted to be 10 degrees or less. Since the off-angle in the c-axis direction is adjusted to be smaller than the off-angle in the a-axis direction, the off-angle in the c-axis direction is smaller than ±10 degrees.

In the case described above, it is preferable that the off-angle in the a-axis direction be adjusted to be larger than 1 degree but equal to or smaller than 10 degrees. Adjusting the off-angle in the a-axis direction in that range is more preferable because it is then possible to obtain a marked effect of reducing the driving voltage and in addition an effect of improving surface morphology.

The nitride semiconductor laser chip 100 according to one embodiment is formed by stacking a plurality of nitride semiconductor layers on the principal growth plane 10a of the GaN substrate 10 described above. Specifically, as shown in FIGS. 2 and 3, in the nitride semiconductor laser chip 100 according to one embodiment, on the principal growth plane 10a of the GaN substrate 10, an n-type GaN layer 11 with a thickness of about 0.1 μm is formed. On the n-type GaN layer 11, a lower clad layer 12 of n-type $Al_{0.06}Ga_{0.94}N$ with a thickness of about 2.2 μm is formed. On the lower clad layer 12, a lower guide layer 13 of n-type GaN with a thickness of about 0.1 μm is formed. On the lower guide layer 13, an active layer 14 is formed. The n-type GaN layer 11, the lower clad layer 12, and the lower guide layer 13 are examples of an "n-type semiconductor layer" according to the present invention. The GaN substrate 10 is formed to be of n type.

Figure 5:
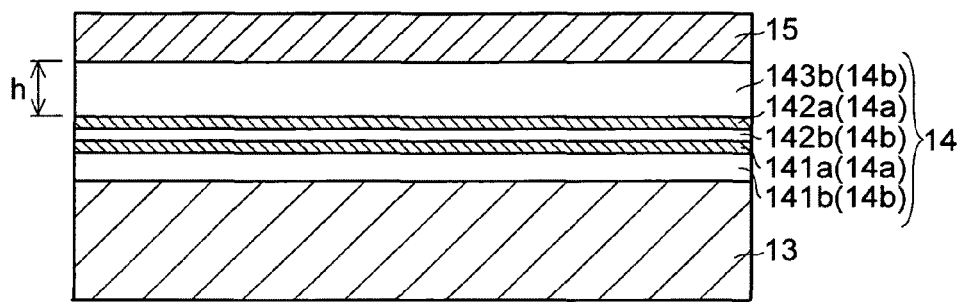
FIG. 5 is a sectional view showing the structure of an active layer in a nitride semiconductor laser chip according to one embodiment of the invention.

As shown in FIG. 5, the active layer 14 has a quantum well (DQW, double quantum well) structure having two well layers 14a of $In_{x1}Ga_{1-x1}N$ and three barrier layers 14b of $In_{x2}Ga_{1-x2}N$ (where x1>x2) alternately stacked. Specifically, the active layer 14 is formed by successively stacking, in order from the lower guide layer 13 side, a first barrier layer 141b, a first well layer 141a, a second barrier layer 142b, a second well layer 142a, and a third barrier layer 143b. The two well layers 14a (the first and second well layers 141a and 142a) are each formed to have a thickness of about 3 nm to about 4 nm. The first barrier layer 141b is formed to have a thickness of about 30 nm, the second barrier layer 142b is formed to have a thickness of about 16 nm, and the third barrier layer 143b is formed to have a thickness of about 60 nm. Thus, the three barrier layers 14b are formed in different thicknesses In this embodiment, the In composition ratio x1 in the well layers 14a (the active layer 14) is 0.15 or more but 0.45 or less (for example, from 0.2 to 0.25). On the other hand, for efficient light confinement, the barrier layers 14b are formed of InGaN, and the In composition ratio x2 there is, for example, from 0.04 to 0.05.

Typically, in a region where the In composition ratio is high (x1≥0.15), a well layer is given a thickness of 3 nm or less. This is to reduce occurrence of misfit dislocations and the like that may result from a lattice mismatch when the In composition ratio is high. However, in a case where the GaN substrate 10 described above, in which the off-angle in the a-axis direction relative to the m plane is larger than 0.1 degrees, is used, even when the well layers 14a are given a thickness of 3 nm or more, occurrence of misfit dislocations and the like is suppressed. The reason is considered to be as follows. With the off-angle in the a-axis direction 0.1 degrees or smaller, when a well layer with a high In composition ratio is formed, the In composition varies greatly across the plane, increasing the In composition locally. This produces a local region where the In composition is high, and from there, dislocations occur. In contrast, with the off-angle in the a-axis direction larger than 0.1 degrees, the In composition is extremely even across the plane; thus, even when the well layers are thick, formation of a local region with a high In composition is less likely. This, it is considered, makes it possible to make the well layers thicker. For increased light confinement and the like, it is preferable that the well layers 14a be given a thickness of 3.2 nm or more. Giving the well layers 14a a thickness of 8 nm or more, however, causes a large number of misfit dislocations to develop, and therefore it is preferable that the well layers 14a be given a thickness of 8 nm or less.

Figure 6:
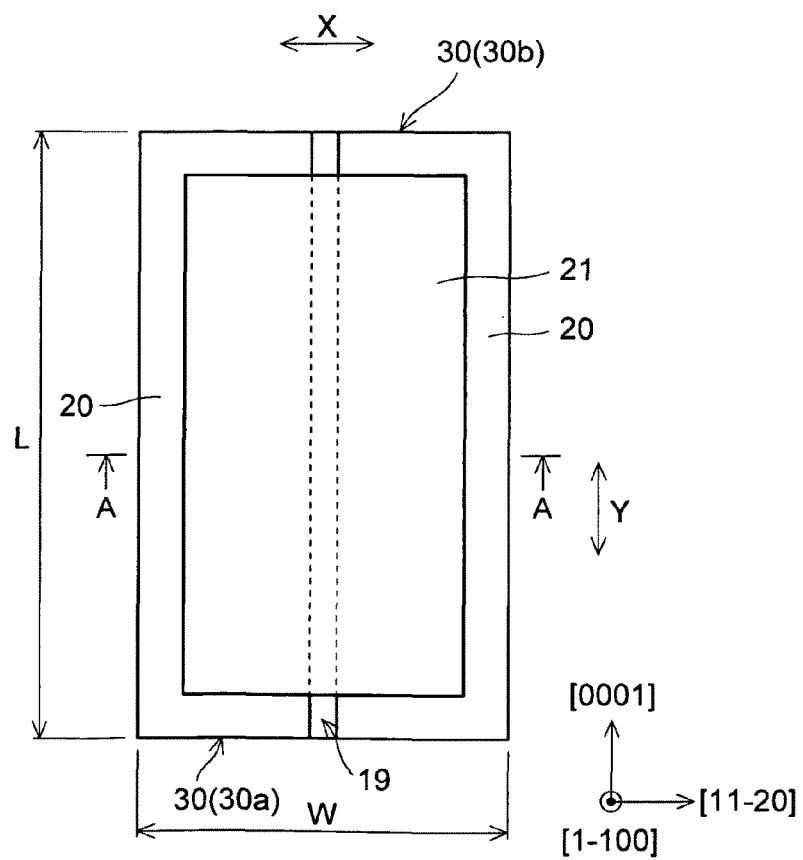
FIG. 6 is a plan view of a nitride semiconductor laser chip according to one embodiment of the invention (a diagram showing the nitride semiconductor laser chip as seen from above)

As shown in FIGS. 2 and 3, on the active layer 14, a carrier block layer 15 of p-type $Al_yGa_{1-y}N$ with a thickness of 40 nm or less (for example, about 12 nm) is formed. The carrier block layer 15 is so formed that the Al composition ratio there is 0.08 or more but 0.35 or less (for example, about 0.15). On the carrier block layer 15, an upper guide layer 16 of p-type GaN is formed, which has an elevated portion and, elsewhere than there, a flat portion. On the elevated portion of the upper guide layer 16, an upper clad layer 17 of p-type $Al_{0.06}Ga_{0.94}N$ with a thickness of about 0.5 µm is formed. On the upper clad layer 17, a contact layer 18 of p-type GaN with a thickness of about 0.1 µm is formed. The contact layer, the upper clad layer 17, and the elevated portion of the upper guide layer 16 together constitute a stripe-shaped (elongate) ridge portion 19 with a width of about 1 µm to about 3 µm (for example, about 1.5 µm). As shown in FIG. 6, the ridge portion 19 is formed to extend in the Y direction (approximately in the c-axis [0001] direction). The carrier block layer 15, the upper guide layer 16, the upper clad layer 17, and the contact layer 18 are examples of a "p-type semiconductor layer" according to the present invention. The p-type semiconductor layers (the carrier block layer 15, the upper guide layer 16, the upper clad layer 17, and the contact layer 18) are doped with Mg as a p-type dopant.

As shown in FIG. 5, for enhanced injection efficiency of carriers into the well layers 14a, the distance h between the carrier block layer 15 and the well layers 14a (the most carrier block layer 15-side one (142a) of the well layers 14a) is set at about 60 nm. It is preferable that the distance h between the carrier block layer 15 and the well layers 14a be set at 80 nm or less, and more preferably 30 nm or less. According to one embodiment, the distance h is equal to the thickness of the third barrier layer 143b.

As shown in FIGS. 2 and 3, on each side of the ridge portion 19, an insulating layer 20 for current constriction is formed. Specifically, on top of the upper guide layer 16, on the side faces of the upper clad layer 17, and on the side faces of the contact layer 18, an insulating layer 20 of $SiO_2$ with a thickness of about 0.1 µm to about 0.3 µm (for example, about 0.15 µm) is formed.

On the top faces of the insulating layer 20 and of the contact layer 18, a p-side electrode 21 is formed so as to cover part of the contact layer 18. The p-side electrode 21, in its part covering the contact layer 18, makes direct contact with the contact layer 18. The p-side electrode 21 has a multiple-layer structure having the following layers stacked successively in order from the insulating layer 20 (the contact layer 18) side: a Pd layer (unillustrated) with a thickness of about 15 nm; a Pt layer (unillustrated) with a thickness of about 15 nm; and a Au layer (unillustrated) with a thickness of about 200 nm.

On the back face of the GaN substrate 10, an n-side electrode 22 is formed, which has a multiple-layer structure having the following layers stacked successively in order from the GaN substrate 10's back face side: a Hf layer (unillustrated) with a thickness of about 5 nm; and an Al layer (unillustrated) with a thickness of about 150 nm. On the n-side electrode 22, a metallized layer 23 is formed, which has a multiple-layer structure having the following layers stacked successively in order from the n-side electrode 22 side: a Mo layer (unillustrated) with a thickness of about 36 nm; a Pt layer (unillustrated) with a thickness of about 18 nm; and a Au layer (unillustrated) with a thickness of about 200 nm.

As shown in FIGS. 3 and 6, the nitride semiconductor laser chip 100 according to one embodiment has a pair of resonator (cavity) faces 30, which include a light emission face 30a and a light reflection face 30b opposite from it. On the light emission face 30a, an emission-side coating (unillustrated) with a reflectance of, for example, 5% to 80% is formed. On the other hand, on the light reflection face 30b, a reflection-side coating (unillustrated) with a reflectance of, for example, 95% is formed. The reflectance of the emission-side coating is adjusted to be a desired value according to the laser output. The emission-side coating is composed of, in order from the semiconductor's emission facet side, for example, a film of aluminum oxide-nitride or aluminum nitride $AlO_xN_{1-x}$ (where $0 \leq x \leq 1$) with a thickness of 30 nm, and a film of $Al_2O_3$ with a thickness of 215 nm. The reflection-side coating is composed of multiple-layered films of, for example, $SiO_2$, $TiO_2$, etc. Other than the materials just mentioned, films of dielectric materials such as SiN, $ZrO_2$, $Ta_2O_5$, $MgF_2$, etc. may be used.

The coating on the light emission face side may instead be composed of a film of $AlO_xN_{1-x}$ (where $0 \leq x \leq 1$) with a thickness of 12 nm, and a film of silicon nitride SiN with a thickness of 100 nm. By forming a film of aluminum oxide-nitride or aluminum nitride $AlO_xN_{1-1}$ (where $0 \leq x \leq 1$) on a cleaved facet (in this embodiment, the c plane), or an etched facet etched by vapor-phase etching or liquid-phase etching, of an m-plane nitride semiconductor substrate as described above, it is possible to greatly reduce the rate of non-radiative recombination at the interface between the semiconductor and the emission-side coating, and thereby to greatly improve the COD (catastrophic optical damage) level. More preferably, the film of aluminum oxide-nitride or aluminum nitride $AlO_xN_{1-x}$ (where $0 \leq x \leq 1$) has a crystal of the same hexagonal crystal system as the nitride semiconductor; further preferably, it is crystallized with its crystal axes aligned with those of the nitride semiconductor, because that further reduces the rate of non-radiative recombination and further improve the COD level. To increase the reflectance on the light emission face side, there may be formed, on the above-mentioned coating, stacked films having films of silicon oxide, aluminum oxide, titanium oxide, tantalum oxide, zirconium oxide, silicon oxide, etc. stacked together.

As shown in FIG. 6, the nitride semiconductor laser chip 100 according to one embodiment has a length L (chip length L, resonator length L) of about 300 µm to about 1800 µm (for example, about 600 µm) in the direction (the Y direction, approximately the c-axis [10001] direction) perpendicular to the resonator faces 30, and has a width W (chip width W) of about 150 µm to about 600 µm in the direction (the X direction, approximately the a-axis [11–20] direction) along the resonator faces 30.

In this embodiment, as described above, a plane having an off-angle in the a-axis direction relative to the m plane is taken as the principal growth plane 10a of the GaN substrate 10, and this makes it possible to suppress a bright-spotted EL emission pattern. That is, with that structure, it is possible to improve the EL emission pattern. This makes it possible to enhance the luminous efficacy of the nitride semiconductor laser chip. By enhancing luminous efficacy, it is possible to obtain a high-luminance nitride semiconductor laser chip. One reason that the above-described effect of suppressing bright-spotted emission is obtained is considered to be as follows: as a result of the principal growth plane 10a of the GaN substrate 10 having an off-angle in the a-axis direction relative to the m plane, when the active layer 14 (the well layers 14a) is grown on the principal growth plane 10a, the direction of migration of In atoms changes so that, even under conditions with a high In composition ratio (with a large supply of In), agglomeration of In is suppressed. Another reason is considered to be that the growth mode of the p-type semiconductor layers formed on the active layer 14 also changes so as to enhance the activation rate of Mg as a p-type dopant and reduce the resistance of the p-type semiconductor layer. Reducing the resistance of the p-type semiconductor layer makes even injection of current easier, and thus make the EL emission pattern even.

In a case where the principal growth plane 10a of the GaN substrate 10 has off-angles in both the a- and c-axis directions relative to the m plane, making the off-angle in the a-axis direction larger than the off-angle in the c-axis direction helps effectively suppress a bright-spotted EL emission pattern. That is, with that structure, it is possible to suppress the inconvenience of the effect of suppressing bright-spotted emission being diminished due to too large an off-angle in the c-axis direction. Thus, it is possible to enhance luminous efficacy easily.

In this embodiment, by suppressing a bright-spotted EL emission pattern, since it is possible to make the EL emission pattern even, it is possible to reduce the driving voltage. Incidentally, by suppressing bright-spotted emission, since it is possible to obtain an even EL emission pattern, it is possible to increase gain in the formation of the nitride semiconductor laser chip.

In this embodiment, with the structure described above, since it is possible to suppress a bright-spotted EL emission pattern, it is possible to enhance luminous efficacy. This makes it possible to enhance chip characteristics and reliability. That is, it is possible to obtain a nitride semiconductor laser chip with superb chip characteristics and high reliability.

In this embodiment, by making the off-angles in the a- and c-axis directions each larger than ±0.1 degrees, it is possible to suppress a bright-spotted EL emission pattern easily. Incidentally, making the off-angle in the a-axis direction larger than ±0.1 degrees helps suppress the inconvenience of surface morphology deteriorating due to the off-angle in the a-axis direction being equal to or smaller than ±0.1 degrees. On the other hand, making the off-angle in the c-axis direction larger than ±0.1 degrees helps suppress the inconvenience of the thickness of the nitride semiconductor layers grown on the principal growth plane 10a becoming uneven due to the off-angle in the c-axis direction being smaller than ±0.1 degrees.

In this embodiment, by making the off-angle in the a-axis direction larger than 0.1 degrees but equal to or smaller than 10 degrees, it is possible to suppress the inconvenience of surface morphology deteriorating due to the off-angle in the a-axis direction being larger than 10 degrees. That is, with the structure described above, it is possible, while obtaining satisfactory surface morphology, to suppress a bright-spotted EL emission pattern easily.

By making the off-angle in the a-axis direction larger than 1 degree but equal to or smaller than 10 degrees, it is possible, while obtaining satisfactory surface morphology, to suppress a bright-spotted EL emission pattern more easily. Setting the off-angle in the a-axis direction in that way is more preferable because it is then possible to obtain a marked effect of reducing the driving voltage and in addition an effect of improving surface morphology.

In a case where a GaN substrate having the m plane as the principal growth plane is used, growing a nitride semiconductor layer on that principal growth plane produces a pyramid-shaped elevated portion on the layer surface of the nitride semiconductor layer. This causes the inconvenience of the thickness of the nitride semiconductor layer changing at the pyramid-shaped elevated portion. On the other hand, by making the off-angle in the a-axis direction relative to the m plane larger than 1 degree but equal to or smaller than 10 degrees, even when a nitride semiconductor layer is grown on that principal growth plane 10a, it is possible to effectively suppress development of a pyramid-shaped elevated portion on the layer surface. Thus, it is possible to effectively suppress the above-mentioned inconvenience of the thickness of the nitride semiconductor layer changing.

In this embodiment, giving the active layer 14 of the nitride semiconductor laser chip 100 a DQW structure makes it possible to reduce the driving voltage easily. This too helps enhance chip characteristics and reliability. Even when the active layer 14 is given a DQW structure, it is possible to suppress a bright-spotted EL emission pattern. In a case where the above-described GaN substrate 10 having a principal growth plane 10a provided with an off-angle relative to the m plane is used, giving the active layer 14 formed on the GaN substrate 10 a DQW structure, as compared with giving the active layer 14 a multiple quantum well (MQW) structure, helps enhance luminous efficacy. This makes it possible to obtain a high-luminance nitride semiconductor laser chip easily.

In this embodiment, by setting the Al composition ratio y in the carrier block layer 15 at 0.08 or more but 0.35 or less, it is possible to form an energy barrier sufficiently high with respect to carriers (electrons), and it is possible to more effectively prevent the carriers injected into the active layer 14 from flowing into the p-type semiconductor layers. In this way, it is possible to suppress a bright-spotted EL emission pattern effectively. Setting the Al composition ratio y in the carrier block layer 15 at 0.35 or less helps suppress an increase in the resistance of the carrier block layer 15 due to the Al composition ratio y being too high. Incidentally, in a region with a high In composition ratio x1 (x1≥0.15) in the well layers 14a, an Al composition ratio of 0.08 or more in the carrier block layer 15 formed on the active layer 14 makes it extremely difficult to grow the carrier block layer 15 satisfactorily. This is because, as the In concentration in the well layers 14a increases, the flatness of the surface of the active layer 14 deteriorates, and this makes it difficult to form a film with a high Al composition ratio y with good crystallinity. However, by use of the GaN substrate 10 having as the principal growth plane 10a a plane having an off-angle in the a-axis direction relative to the m plane, even in a case where the In composition ratio x1 in the active layer 14 (the well layers 14a) is 0.15 or more but 0.45 or less, it is possible to form a carrier block layer 15 with an Al composition ratio y of 0.08 or more but 0.35 or less with good crystallinity. This makes it possible to suppress a bright-spotted EL emission pattern effectively and make the EL emission pattern even.

By use of the above-described GaN substrate 10 having a principal growth plane 10a provided with an off-angle relative to the m plane, even with the In composition ratio x1 in the well layers 14a 0.15 or more, that is, even under conditions where a bright-spotted EL emission pattern is prominent, it is possible to effectively suppress a bright-spotted EL emission pattern. Thus, by making the In composition ratio x1 in the well layers 14a of the active layer 14 0.15 or more, it is possible to obtain a prominent effect of suppressing a bright-spotted EL emission pattern. On the other hand, by making the In composition ratio x1 in the well layers 14a of the active layer 14 0.45 or less, it is possible to suppress the inconvenience of a large number of dislocations developing in the active layer 14 as a result of strain such as a lattice mismatch due to the In composition ratio x1 in the active layer 14 being more than 0.45.

In this embodiment, by forming the barrier layer 14b formed under the well layers 14a (on the GaN substrate 10 side) out of InGaN, and making the In composition ratio x2 there 0.01 or more, it is possible to greatly enhance the efficiency of absorption of In into the well layers 14a. This makes it possible to maintain a high In composition ratio even when the gas flow amount of In is reduced, and thus helps improve absorption efficiency. In this way, it is possible to achieve wavelength lengthening effectively. It is also possible to reduce the consumption of the material gas (TMIn, i.e., trimethyl indium), which is advantageous in terms of cost.

Setting the distance h between the carrier block layer 15 and the well layers 14a at 200 nm or more permits current to spread when carriers diffuse from the carrier block layer 15 to the active layer 14, and thus helps slightly suppress bright-spotted emission. On the other hand, by the use of the above-described GaN substrate 10 having a principal growth plane 10a provided with an off-angle relative to the m plane, even when the distance h between the carrier block layer 15 and the well layers 14a is not set at 200 nm or more, it is possible to suppress bright-spotted emission effectively. For example, even when the distance h between the carrier block layer 15 and the well layers 14a is set at less than 120 nm, it is possible to suppress bright-spotted emission effectively. The smaller the distance h between the carrier block layer 15 and the well layers 14a, the more preferable, because that enhances the injection efficiency of carriers into the well layers 14a. Accordingly, by making the distance h between the carrier block layer 15 and the well layers 14a less than 120 nm, it is possible to enhance the injection efficiency of carriers into the well layers 14a.

FIGS. 7 to 19 are diagrams illustrating a method of manufacture of a nitride semiconductor laser chip according to one embodiment of the invention. Next, with reference to FIGS. 2, 3, and 5-19, a method of manufacture of the nitride semiconductor laser chip 100 according to one embodiment of the invention will be described.

Figure 7:
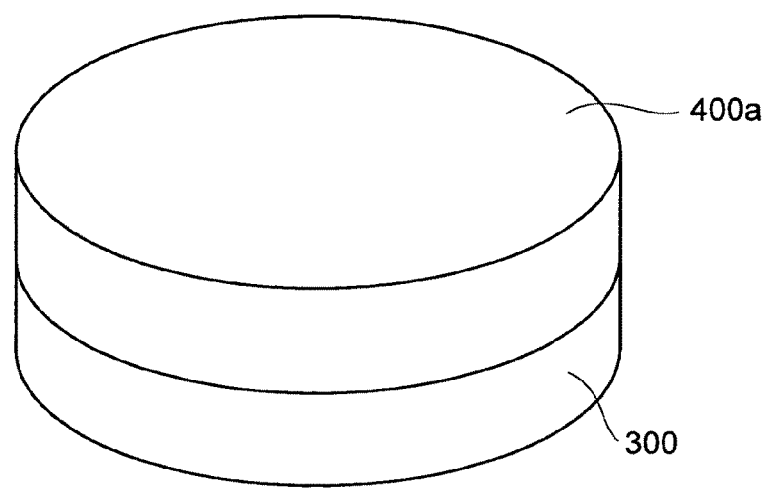
FIG. 7 is a perspective view illustrating a method of manufacture of a nitride semiconductor laser chip according to one embodiment of the invention (a diagram illustrating a method of manufacture of a substrate)
Figure 8:
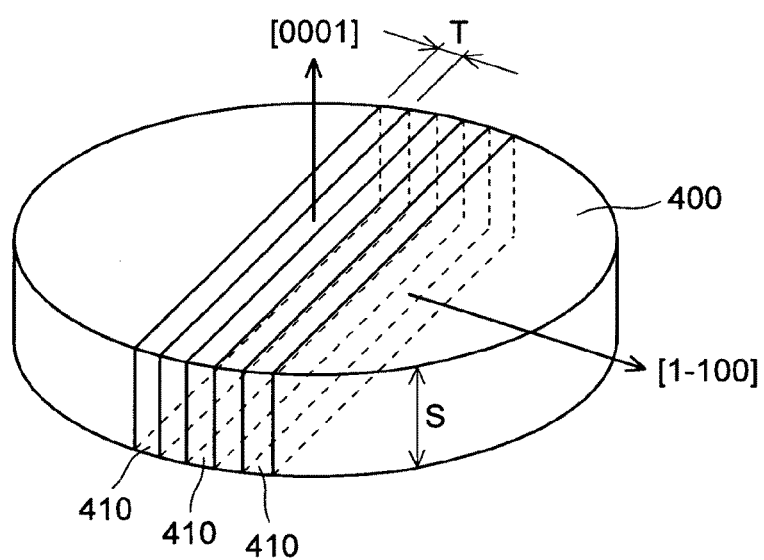
FIG. 8 is a perspective view illustrating a method of manufacture of a nitride semiconductor laser chip according to one embodiment of the invention (a diagram illustrating a method of manufacture of a substrate)

First, a GaN substrate 10 having as a principal growth plane 10a a plane having off-angles in both the a- and c-axis directions is prepared. This GaN substrate 10 is fabricated by, for example, using as a seed substrate a substrate cut out of a GaN bulk crystal having the c plane (0001) as a principal plane and growing a GaN crystal on top of that seed substrate. Specifically, as shown in FIG. 7, a protective film (unillustrated) of SiO$_2$ is formed on part of a base substrate 300, and then on top of the base substrate 300, over the protective film, a GaN bulk crystal is grown by an epitaxial growth process such as an MOCVD (metal organic chemical vapor deposition) process. This causes growth to start in the part where the protective film is not formed, and over the protective film, the GaN crystal grows laterally. The parts of the GaN crystal grown laterally meet over the protective film and continue to grow, and thus a GaN crystal layer 400a is formed on top of the base substrate 300. The GaN crystal layer 400a is formed sufficiently thick so that it may be handled independently even after removal of the base substrate 300. Next, from the GaN crystal layer 400a thus formed, the base substrate 300 is removed, for example, by etching. This leaves, as shown in FIG. 8, a GaN bulk crystal 400 having the c plane (0001) as a principal plane. As the base substrate 300, it is possible to use a GaAs substrate, a sapphire substrate, a ZnO substrate, a SiC substrate, a GaN substrate, etc. The GaN bulk crystal 400 is given a thickness S of, for example, about 3 mm.

Next, both principal planes, that is, the (0001) and (000-1) planes, of the GaN bulk crystal 400 thus obtained are ground and polished so as to each have an average roughness Ra of 5 nm. The average roughness Ra here conforms to the arithmetic average roughness Ra defined in JIS B 0601, and can be measured on an AFM (atomic force microscope).

Figure 9:
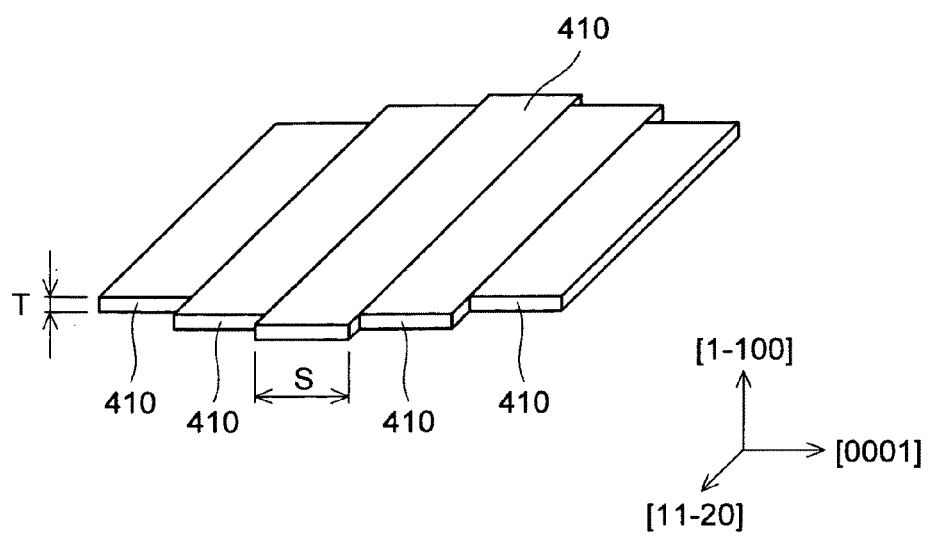
FIG. 9 is a perspective view illustrating a method of manufacture of a nitride semiconductor laser chip according to one embodiment of the invention (a diagram illustrating a method of manufacture of a substrate)
Figure 10:
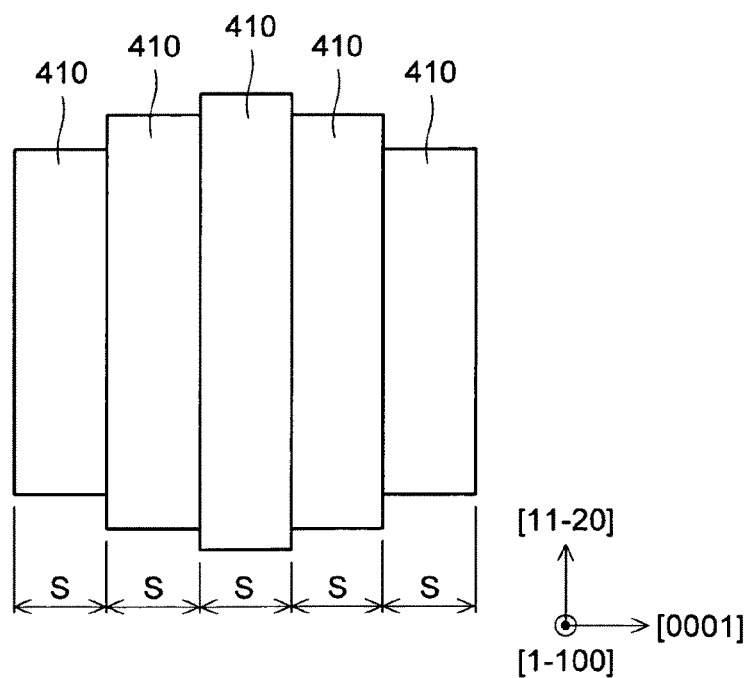
FIG. 10 is a plan view illustrating a method of manufacture of a nitride semiconductor laser chip according to one embodiment of the invention (a diagram illustrating a method of manufacture of a substrate)

Next, the GaN bulk crystal 400 is sliced at a plurality of planes perpendicular to the [1-100] direction so that a plurality of GaN crystal substrates 410 having the m plane {1-100} as a principal plane are cut out each with a thickness T (for example, 1 mm) (and with a width S of 3 mm). Then, with each of the GaN crystal substrates 410 thus cut out, the four faces that have not yet ground or polished are ground and polished so as to have an average roughness Ra of 5 nm. Thereafter, as shown in FIGS. 9 and 10, the plurality of GaN crystal substrates 410 are arranged side by side in such a way that their respective principal planes are parallel to one another and that their respective [0001] directions are aligned with one another.

Figure 11:
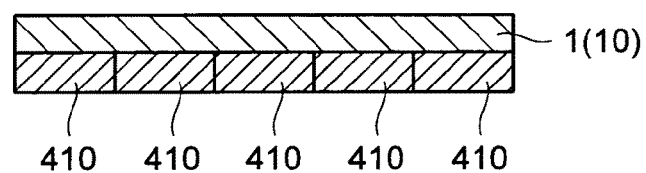
FIG. 11 is a sectional view illustrating a method of manufacture of a nitride semiconductor laser chip according to one embodiment of the invention (a diagram illustrating a method of manufacture of a substrate)

Subsequently, as shown in FIG. 11, the plurality of GaN crystal substrates 410 thus arranged side by side are taken as a seed substrate, and on the m plane {1-100} of those GaN crystal substrates 410, a GaN crystal is grown by an epitaxial growth process such as an HVPE process. In this way, a GaN substrate 1 having the m plane as a principal growth plane is obtained. Next, the principal plane of the GaN substrate 1 thus obtained is polished by chemical and mechanical polishing so as to control the off-angles in the a- and c-axis directions independently, thereby to set the off-angles in the a- and c-axis directions relative to the m plane at desired off-angles. These off-angles can be measured by an X-ray diffraction method. In this way, a GaN substrate 10 having as a principal growth plane a plane having off-angles in both the a- and c-axis directions relative to the m plane is obtained.

In the above-described fabrication of the GaN substrate 10, in a case where a substrate with a large off-angle is fabricated, when a plurality of GaN crystal substrates 410 are cut out of the GaN bulk crystal 400, they may be cut out at a predetermined cut-out angle relative to the [1-100] direction so that the principal plane of the GaN crystal substrates 410 has a desired off-angle relative to the m plane {1-100}. Doing so permits the principal plane of the GaN crystal substrates 410 to have a desired off-angle relative to the m plane {1-100}, and accordingly the principal plane (principal growth plane) of the GaN substrate 1 (10) formed on that principal plane comes to have the desired off-angle relative to the m plane {1-100}.

Polishing the principal plane of the GaN crystal substrates 410 cut out of the GaN bulk crystal 400 (see FIG. 8) by chemical and mechanical polishing makes it possible to use the GaN crystal substrates 410 as the GaN substrate 10. In that case, the width S of the GaN crystal substrates 410 may be 3 mm or more.

Here, in this embodiment, the off-angles in the a- and c-axis directions are each so adjusted as to be larger than ±0.1 degrees. Moreover, the off-angle in the a-axis direction is adjusted to be larger than the off-angle in the c-axis direction. Furthermore, to suppress deterioration of surface morphology, the off-angle in the a-axis direction is adjusted to be equal to or smaller than 10 degrees. Since the off-angle in the c-axis direction is adjusted to be smaller than the off-angle in the a-axis direction, the off-angle in the c-axis direction is smaller than ±10 degrees.

Figure 12:
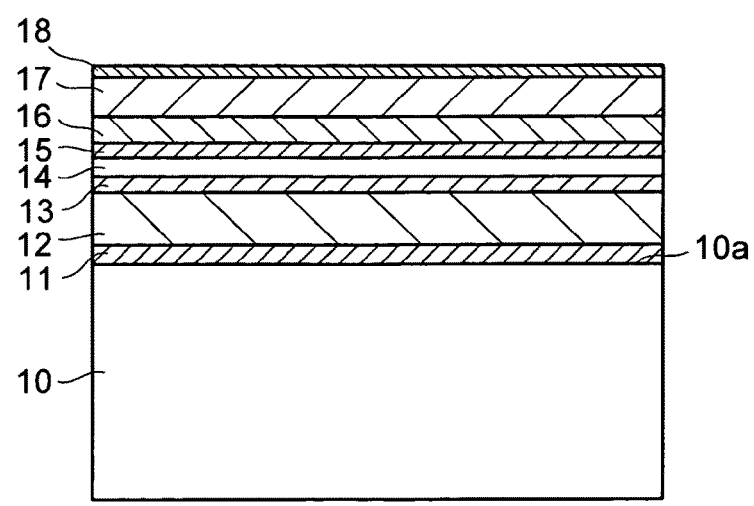
FIG. 12 is a sectional view illustrating a method of manufacture of a nitride semiconductor laser chip according to one embodiment of the invention.

Subsequently, as shown in FIG. 12, on the principal growth plane 10a of the GaN substrate 10 obtained, individual nitride semiconductor layers 11 to 18 are grown by an MOCVD process. Specifically, on the principal growth plane 10a of the GaN substrate 10, the following layers are grown successively: an n-type GaN layer 11 with a thickness of about 0.1 µm; a lower clad layer 12 of n-type $Al_{0.06}Ga_{0.94}N$ with a thickness of about 2.2 µm; a lower guide layer 13 of n-type GaN with a thickness of about 0.1 µm; and an active layer 14. When the active layer 14 is grown, as shown in FIG. 5, two well layers 14a of $In_{x1}Ga_{1-x1}N$ and three barrier layers 14b of $In_{x2}Ga_{1-x2}N$ (where x1>x2) are alternately grown. Specifically, on the lower guide layer 13, the following layers are grown successively from bottom up: a first barrier layer 141b with a thickness of about 30 µm; a first well layer 141a with a thickness of about 3 nm to about 4 nm; a second barrier layer 142b with a thickness of about 16 nm; a second well layer 142a with a thickness of about 3 nm to about 4 nm; and a third barrier layer 143b with a thickness of about 60 nm. In this way, on the lower guide layer 13, an active layer 14 having a DQW structure composed of two well layers 14a and three barrier layers 14b is formed. At this time, the well layers 14a are so formed that the In composition ratio x1 there is 0.15 or more but 0.45 or less (for example, 0.2 to 0.25). On the other hand, the barrier layers 14b are so formed that the In composition ratio x2 there is, for example, 0.04 to 0.05.

Next, as shown in FIG. 12, on the active layer 14, the following layers are grown successively: a carrier block layer 15 of p-type $Al_yGa_{1-y}N$; an upper guide layer 16 of p-type GaN with a thickness of about 0.05 µm; an upper clad layer 17 of p-type $Al_{0.06}Ga_{0.94}N$ with a thickness of about 0.5 µm; and a contact layer 18 of p-type GaN with a thickness of about 0.1 µm. At this time, it is preferable that the carrier block layer 15 be formed so as to have a thickness of 40 nm or less (for example, about 12 nm). Moreover, the carrier block layer 15 is so formed that the Al composition ratio y there is 0.08 or more but 0.35 or less (for example, about 0.15). The n-type semiconductor layers (the n-type GaN layer 11, the lower clad layer 12, and the lower guide layer 13) are doped with, for example, Si as an n-type dopant, and the p-type semiconductor layers (the carrier block layer 15, the upper guide layer 16, the upper clad layer 17, and the contact layer 18) are doped with Mg as a p-type dopant.

In this embodiment, the n-type semiconductor layers are formed at a growth temperature of 900° C. or higher but lower than 1300° C. (for example, 1075° C.). The well layers 14a of the active layer 14 are formed at a growth temperature of 600° C. or higher but 770° C. or lower (for example, 700° C.). The barrier layers 14b, which are contiguous with the well layers 14a, are formed at the same growth temperature (for example, 700° C.) as the well layers 14a. The p-type semiconductor layers are formed at a growth temperature of 700° C. or higher but lower than 900° C. (for example, 880° C.). The growth temperature of the n-type semiconductor layers is preferably 900° C. or higher but lower than 1300° C., and more preferably 1000° C. or higher but lower than 1300° C. The growth temperature of the well layers 14a of the active layer 14 is preferably 600° C. or higher but 830° C. or lower, and in a case where the In composition ratio x1 in the well layers 14a is 0.15 or more, preferably 600° C. or higher but 770° C. or lower; more preferably, 630° C. or higher but 740° C. or lower. The growth temperature of the barrier layers 14b of the active layer 14 is preferably the same as or higher than that of the well layers 14a. The growth temperature of the p-type semiconductor layers is preferably 700° C. or higher but lower than 900° C., and more preferably 700° C. or higher but 880° C. or lower. Needless to say, since even forming a p-type semiconductor layer at a temperature of 900° C. or higher gives p-type conductivity, the p-type semiconductor layers may be formed at a temperature of 900° C. or higher.

Figure 13:
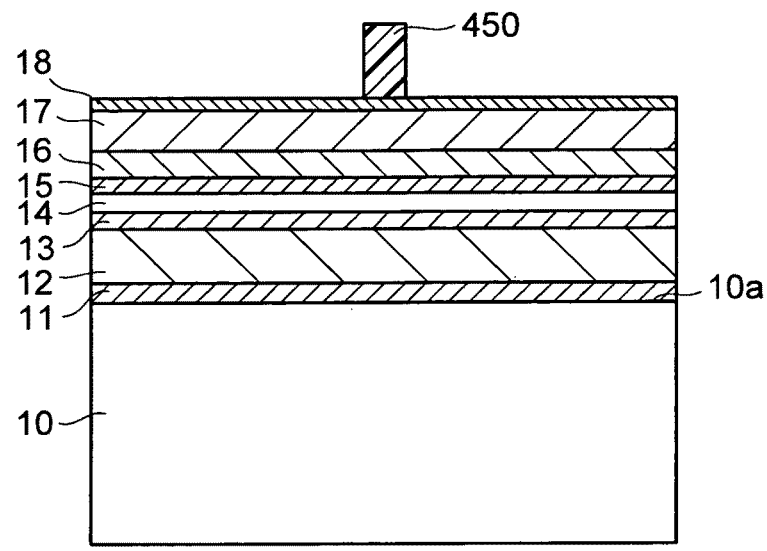
FIG. 13 is a sectional view illustrating a method of manufacture of a nitride semiconductor laser chip according to one embodiment of the invention.
Figure 14:
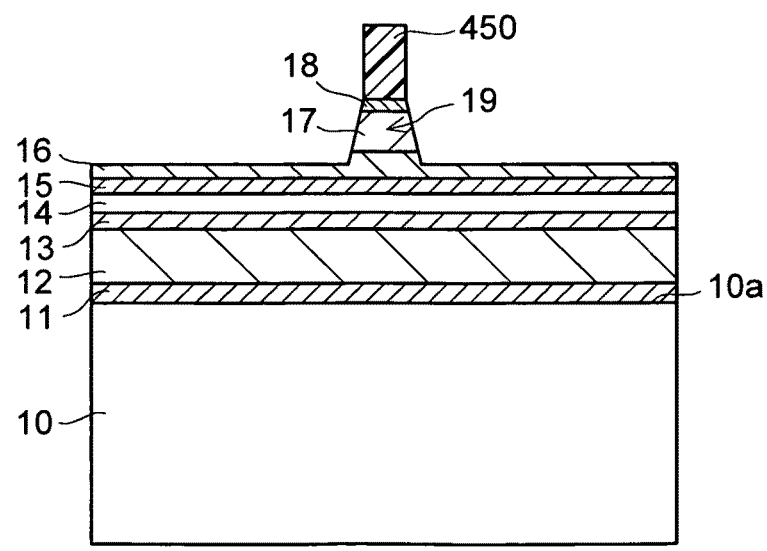
FIG. 14 is a sectional view illustrating a method of manufacture of a nitride semiconductor laser chip according to one embodiment of the invention.

Next, as shown in FIG. 13, by a photolithography technology, on the contact layer 18, a stripe-shaped (elongate) resist layer 450 is formed that has a width of about 1 µm to about 3 µm (for example, about 1.5 µm) and that extends parallel to the Y direction (approximately the c-axis [0001] direction). Then, as shown in FIG. 14, by a RIE (reactive ion etching) process using chlorine-based gas such as $SiCl_4$ or $Cl_2$ or Ar gas, and with the resist layer 450 used as a mask, etching is performed halfway (not limited to exactly half) into the depth of the upper guide layer 16. In this way, a stripe-shaped (elongate) ridge portion 19 (see FIGS. 3 and 6) is formed which is constituted by an elevated portion of the upper guide layer 16, the upper clad layer 17, and the contact layer 18 and which extends parallel to the Y direction (approximately the c-axis [0001] direction).

Figure 15:
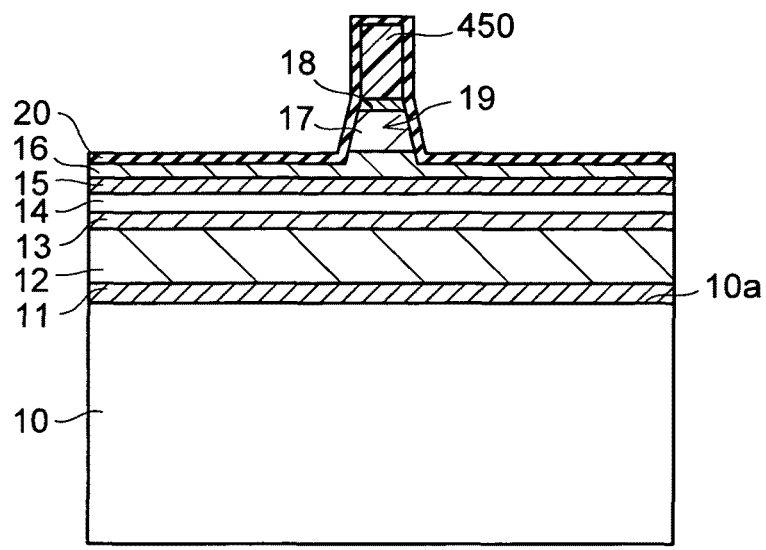
FIG. 15 is a sectional view illustrating a method of manufacture of a nitride semiconductor laser chip according to one embodiment of the invention.
Figure 16:
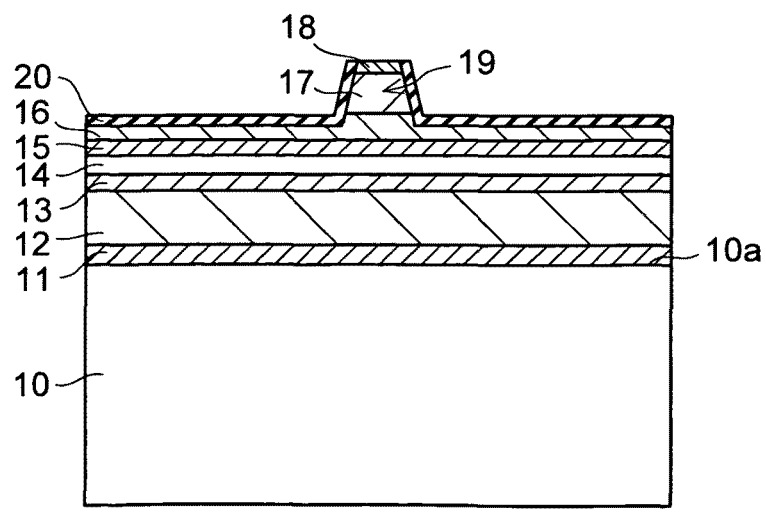
FIG. 16 is a sectional view illustrating a method of manufacture of a nitride semiconductor laser chip according to one embodiment of the invention.

Subsequently, as shown in FIG. 15, with the resist layer 450 left on the ridge portion 19, by a sputtering process or the like, an insulating layer 20 of $SiO_2$ with a thickness of about 0.1 µm to about 0.3 µm (for example, about 0.15 µm) is formed to bury the ridge portion 19. Then, the resist layer 450 is removed by lift-off so that the contact layer 18 at the top of the ridge portion 19 is exposed. In this way, on each side of the ridge portion 19, a insulating layer 20 as shown in FIG. 16 is formed.

Figure 17:
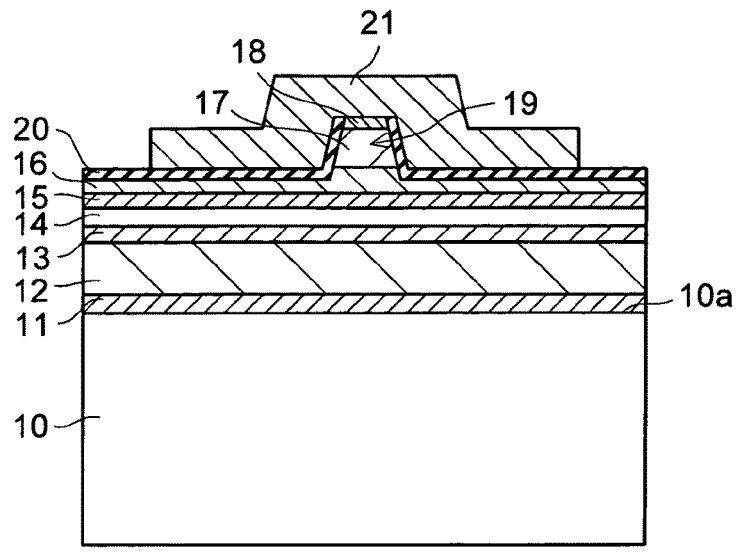
FIG. 17 is a sectional view illustrating a method of manufacture of a nitride semiconductor laser chip according to one embodiment of the invention.

Next, as shown in FIG. 17, by a vacuum deposition process or the like, a Pd layer (unillustrated) with a thickness of about 15 µm and a Au layer (unillustrated) with a thickness of about 200 nm are formed successively from the substrate side (the insulating layer 20 side). Thus, on the insulating layer 20 (the contact layer 18), a p-side electrode 21 having a multiple-layer structure is formed.

Next, to make the substrate easy to split, the back face of the GaN substrate 10 is ground or polished until the thickness of the GaN substrate 10 is reduced to about 100 µm. Thereafter, as shown in FIG. 2, on the back face of the GaN substrate 10, by a vacuum deposition process or the like, a Hf layer (unillustrated) with a thickness of about 5 nm and an Al layer (unillustrated) with a thickness of about 150 nm are formed successively from the GaN substrate 10's back face side. Thus, an n-side electrode 22 having a multiple-layer structure is formed. Then, on the n-side electrode 22, a Mo layer (unillustrated) with a thickness of about 36 nm, a Pt layer (unillustrated) with a thickness of about 18 nm, and a Au layer (unillustrated) with a thickness of about 200 nm are formed successively from the n-side electrode 22 side. Thus, a metallized layer 23 having a multiple-layer structure is formed. Before the n-side electrode 22 is formed, dry etching or wet etching may be performed for the purpose of, for example, adjusting the n-side electrical characteristics.

Figure 18:
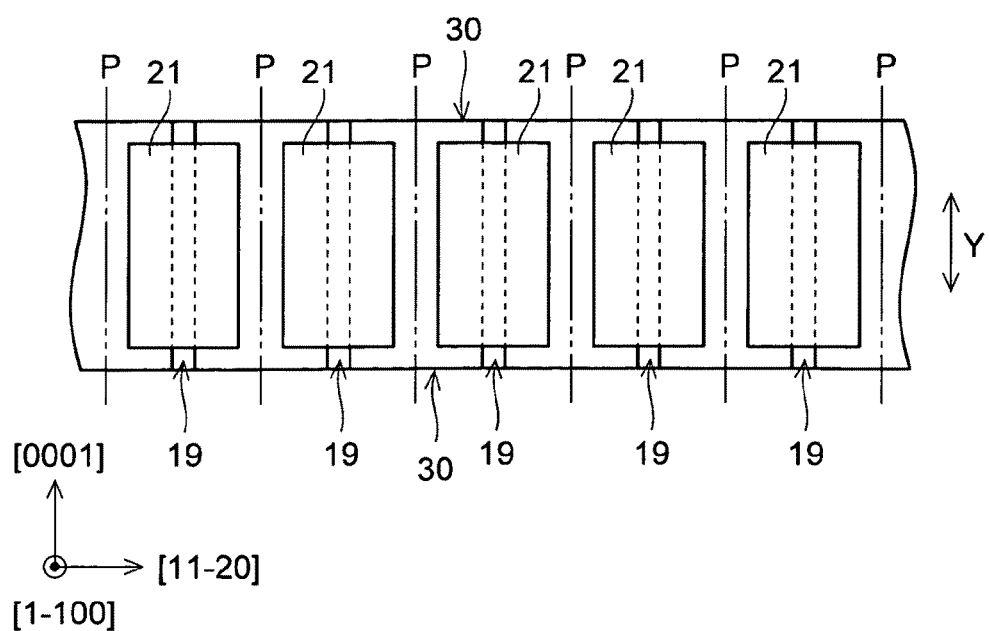
FIG. 18 is a sectional view illustrating a method of manufacture of a nitride semiconductor laser chip according to one embodiment of the invention.

Subsequently, as shown in FIG. 18, by a scribing-breaking process, a laser scribing process, or the like, the substrate is split into bars. This produces a bar-shaped array of chips having resonator faces 30 at the split facets. Next, by a vacuum deposition process, a sputtering process, or the like, a coating is applied to the facets (resonator faces 30) of the bar-shaped array of chips. Specifically, on one of the facets which will serve as a light emission face, an emission-side coating (unillustrated) of, for example, a film of aluminum oxide-nitride or the like is formed. On the facet opposite from it, which will serve as a light reflection face, a reflection-side coating (unillustrated) of, for example, multiple-layered films of $SiO_2$, $TiO_2$, etc. is formed.

Figure 19:
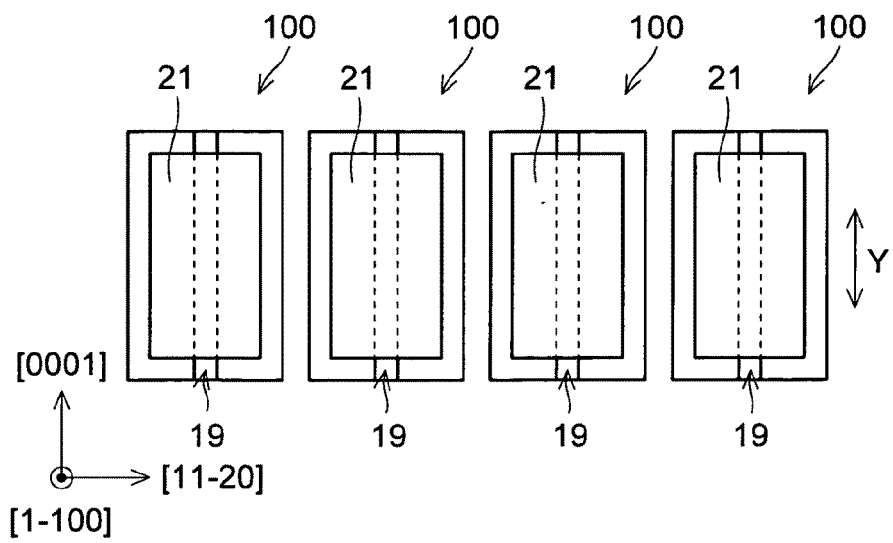
FIG. 19 is a sectional view illustrating a method of manufacture of a nitride semiconductor laser chip according to one embodiment of the invention.

Lastly, the bar-shaped array of chips is split along planned splitting lines P along the Y direction (approximately the c-axis [0001] direction) into separate pieces of individual nitride semiconductor laser chips as shown in FIG. 19. In this way, the nitride semiconductor laser chip 100 according to one embodiment of the invention is manufactured.

Figure 20:
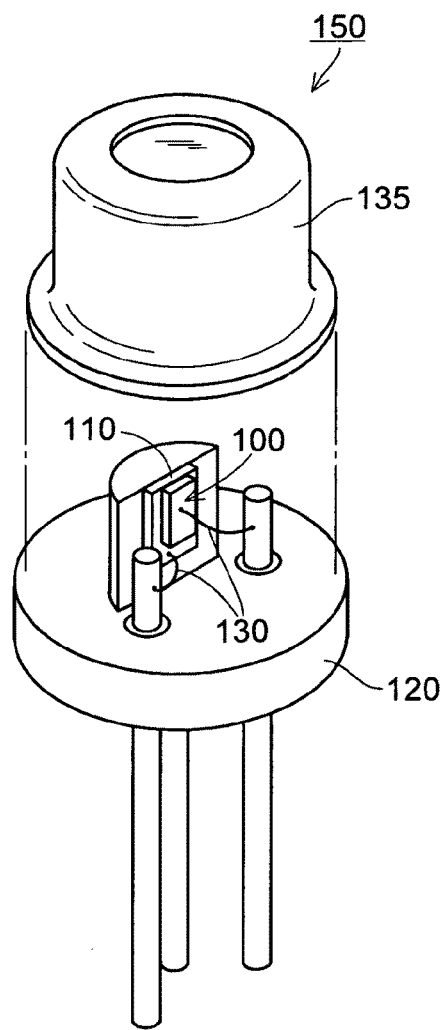
FIG. 20 is a perspective view of a semiconductor laser device provided with a nitride semiconductor laser chip according to one embodiment of the invention.

The nitride semiconductor laser Chip 100 according to one embodiment of the invention manufactured as described above is, as shown in FIG. 20, mounted on a stem 120 with a sub-mount 110 interposed in between and is electrically connected to lead pins by wires 130. Then, a cap 135 is welded on top of the stem 120 to complete assemblage into a can-packaged semiconductor laser device (semiconductor optical device) 150.

In the method of manufacture of the nitride semiconductor laser chip 100 according to this embodiment, forming the n-type semiconductor layers at a high temperature of 900° C. or higher as described above helps make the layer surface of the n-type semiconductor layers flat. Thus, by forming the active layer 14 and the p-type semiconductor layers on the n-type semiconductor layers thus made flat, it is possible to suppress degradation of crystallinity in the active layer 14 and the p-type semiconductor layers. This too makes it possible to form a high-quality crystal. On the other hand, forming the n-type semiconductor layers at a growth temperature lower than 1300° C. helps suppress the inconvenience of the surface of the GaN substrate 10 re-evaporating and becoming rough during the raising of temperature due to the n-type semiconductor layers being formed at a growth temperature of 1300° C. or higher. Thus, with this scheme, it is possible to easily manufacture a nitride semiconductor laser chip 100 with superb chip characteristics and high reliability.

In this embodiment, forming the well layers 14a of the active layer 14 at a growth temperature of 600° C. or higher helps suppress the inconvenience of a shorter atom diffusion length and hence degraded crystallinity due to the well layers 14a being formed at a growth temperature lower than 600° C. On the other hand, forming the well layers 14a of the active layer 14 at a growth temperature of 770° C. or lower helps suppress the inconvenience of the active layer 14 being blackened by thermal damage due to the well layers 14a of the active layer 14 being formed at a growth temperature higher than 770° C. (for example, 830° C. or higher). The growth temperature of the barrier layers 14b, which are contiguous with the well layers 14a, is preferably the same as or higher than that of the well layers 14a.

In this embodiment, forming the p-type semiconductor layers at a growth temperature of 700° C. or higher helps suppress the inconvenience of the p-type semiconductor layers having a high resistance due to their growth temperature being too low. On the other hand, forming the p-type semiconductor layers at a growth temperature lower than 900° C. helps reduce thermal damage to the active layer 14. In a case where a GaN substrate having the c plane as a principal growth plane is used, forming the p-type semiconductor layers at a growth temperature lower than 900° C. causes the p-type semiconductor layers to have an extremely high resistance and thus makes the resulting device (nitride semiconductor light-emitting chip) difficult to use as such. By contrast, using the above-described GaN substrate 10 having as the principal growth plane 10a a plane provided with an off-angle in the a-axis direction relative to the m plane makes it possible, even at a growth temperature lower than 900° C., to obtain p-type conductivity by use of Mg as a p-type dopant. In particular, in a case where the In composition ratio x1 in the well layers 14a of the active layer 14 is 0.15 or more but 0.45 or less, the In composition tends to vary across the plane due to segregation of In and the like. Thus, the lower the growth temperature of the p-type semiconductor layers, the more preferable. The difference between the growth temperature of the well layers 14a of the active layer 14 and the growth temperature of the p-type semiconductor layers is preferably less than 200° C. from the viewpoint of avoiding thermal damage to the active layer 14, and more preferably 150° C. or less.

Figure 21:
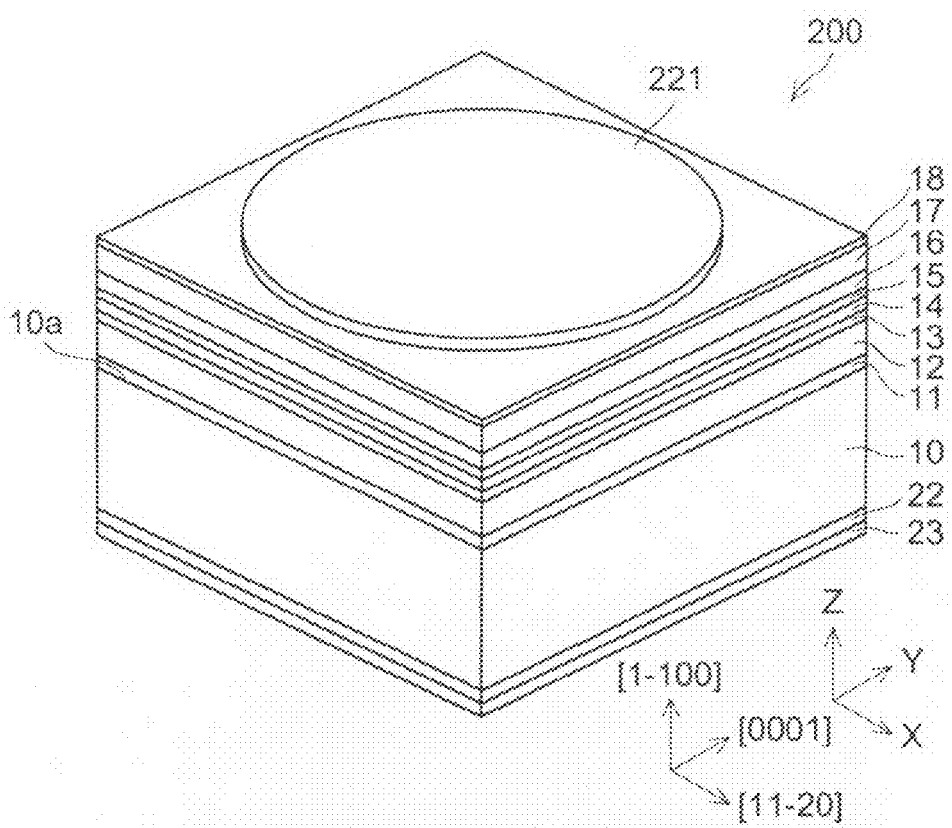
FIG. 21 is a perspective view of a light-emitting diode chip fabricated for confirmation of the effect of a nitride semiconductor laser chip according to one embodiment of the invention.

Next, a description will be given of experiments conducted to verify the effect of the GaN substrate 10 according to the embodiment described above. In these experiments, first, as a test chip, a light-emitting diode chip 200 as shown in FIG. 21 was fabricated, and the EL emission pattern was inspected. The reason that a light-emitting diode chip was used for the inspection of the EL emission pattern is that, with a nitride semiconductor laser chip, which has a constricted current injection region as a result of a ridge portion being formed, it is difficult to inspect the EL emission pattern.

Figure 22:
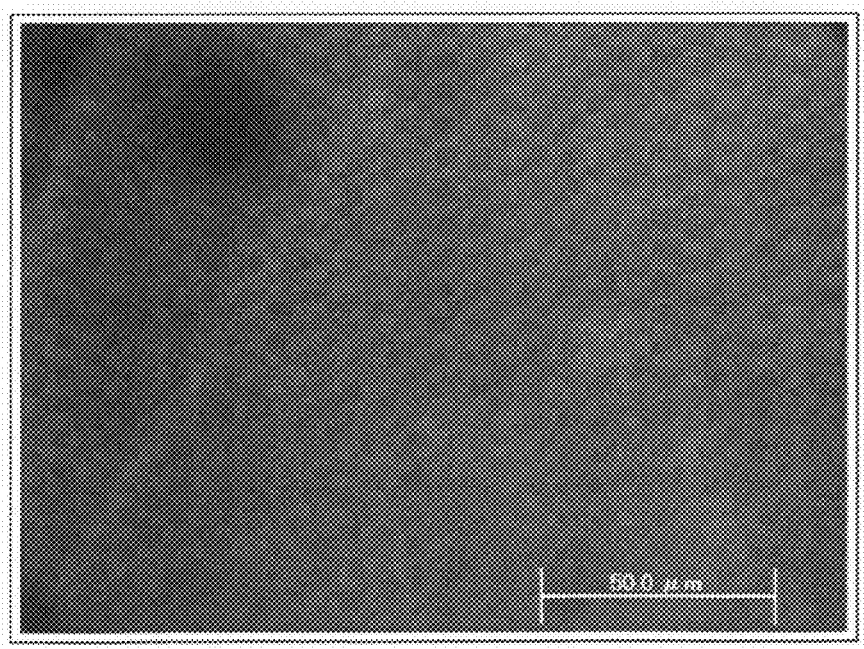
FIG. 22 is a microscope image of an EL emission pattern observed with a test chip.

The test chip (the light-emitting diode chip 200) was fabricated by forming nitride semiconductor layers similar to those in the above-described embodiment on a GaN substrate similar to that in the above-described embodiment. The nitride semiconductor layers were formed in similar manners as in the above-described embodiment. Specifically, as shown in FIG. 21, a GaN substrate 10 having as a principal growth plane 10a a plane having an off-angle relative to the m plane was used, and on that principal growth plane 10a, the following layers were formed successively: an n-type GaN layer 11, a lower clad layer 12, a lower guide layer 13, an active layer 14, a carrier block layer 15, an upper guide layer 16, an upper clad layer 17, and a contact layer 18. Next, on the contact layer 18, a p-side electrode 221 was formed. This p-side electrode 221 was made transparent to allow inspection of the EL emission pattern. On the back face of the GaN substrate 10, an n-side electrode 22 and a metallized layer 23 were formed. In the test chip, the GaN substrate 10 had an off-angle of 1.7 degrees in the a-axis direction and an off-angle of +0.1 degrees in the c-axis direction. In the test chip, the In composition ratio in the well layers was 0.25. Current was injected into the thus fabricated test chip (the light-emitting diode chip 200) to make it emit light, and the light distribution across the plane was inspected. FIG. 22 shows a microscope image of the EL emission pattern observed with the test chip.

On the other hand, as a comparison chip, a light-emitting diode chip employing a GaN substrate having the m plane as a principal growth plane (an m-plane just substrate) was fabricated. This comparison chip was fabricated in the same manner as the test chip described above. The gas flow amount of In was the same as for the test chip, but in the comparison chip, the In composition ratio in the well layers was 0.2. As with the test chip, the light distribution across the plane was inspected. Except employing an m-plane just substrate as the GaN substrate and having an In composition ratio of 0.2 in the well layers, the comparison chip had a similar structure to the test chip (the light-emitting diode chip 200). The EL emission pattern shown in FIG. 24 is (a microscope image of) one observed with the test chip.

Figure 24:
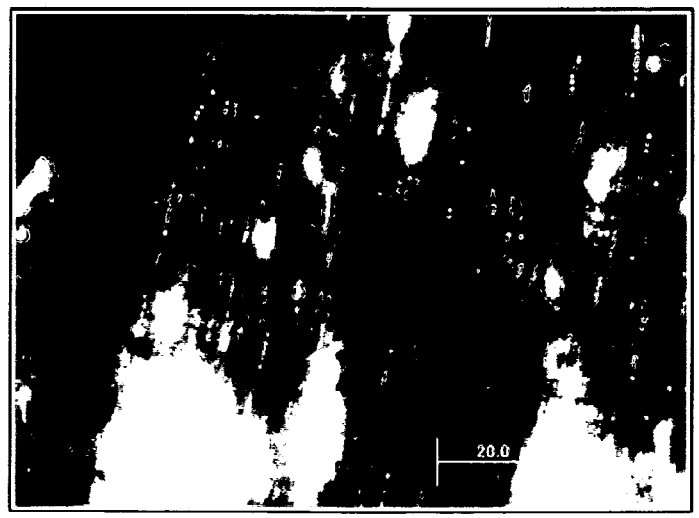
FIG. 24 is a microscope image showing a bright-spotted EL emission pattern (a microscope image of an EL emission pattern observed with a comparison chip).

Whereas the comparison chip exhibits a bright-spotted EL emission pattern as shown in FIG. 24, the test chip, despite a high In composition ratio in the well layers, exhibits an EL emission pattern of even light emission as a result of a bright-spotted EL emission pattern being suppressed. This confirms that using a GaN substrate 10 having as a principal growth plane 10a a plane having an off-angle in the a-axis direction relative to the m plane helps suppress a bright-spotted EL emission pattern. On the other hand, measurements of luminous efficacy with the test chip and the comparison chip confirmed that the luminous efficacy of the test chip was increased to 1.5 times that of the comparison chip. The emission wavelength of the test chip was 510 nm, and the emission wavelength of the comparison chip was 500 nm. This confirms that the test chip, in which the off-angle is controlled, is more efficient also in terms of In absorption than the comparison chip, which uses an m-plane just substrate. Thus, it is confirmed that providing an off-angle in the a-axis direction relative to the m plane helps suppress bright-spotted emission and increase luminous efficacy in a wavelength region of green.

Subsequently, by use of a plurality of GaN substrates with different off-angles in the a- and c-axis directions, a plurality of chips like the light-emitting diode chip 200 shown in FIG. 21 were fabricated, and were subjected to experiments including inspection of the EL emission pattern.

The results reveals that providing an off-angle in the a-axis direction relative to the m plane gives the effect of suppressing a bright-spotted EL emission pattern. It is found that, whereas the effect of suppressing bright-spotted emission is weak with the off-angle in the a-axis direction in the range of 0.1 degrees or smaller, the effect of suppressing a bright-spotted EL emission pattern is prominent with the off-angle in the a-axis direction 0.1 degrees or larger. It is also found that, the effect of suppressing bright-spotted emission is weak with the off-angle in the c-axis direction in the range of ±0.1 degrees or smaller. It is considered that, with the off-angles in the a- and c-axis directions both in the range of 0.1 degrees or less, the off-angles are so small as to be almost the same as in a substrate provided with no off-angle (a just substrate) and this makes it difficult to obtain the effect of suppressing bright-spotted emission. Thus, it is confirmed that by using as the principal growth plane of a GaN substrate a plane having an off-angle in the a-axis direction relative to the m plane, it is possible to suppress a bright-spotted EL emission pattern. It is also confirmed that an off-angle larger than 10 degrees in the a-axis direction, while giving the effect of suppressing bright-spotted emission, tends to degrade surface morphology. It is further confirmed that, with the off-angle in the a-axis direction in the range of ±0.1 degrees or less, surface morphology deteriorates and, with the off-angle in the c-axis direction in the range of ±0.1 degrees or less, the thicknesses of the n-type semiconductor layers and of the p-type semiconductor layers varies across the plane. It is in addition confirmed that the off-angle in the c-axis direction shows similar tendencies in the + and − directions and can therefore be discussed in terms of an absolute value.

Interestingly, with regard to the effect of suppressing bright-spotted emission, a strong correlation is observed between the off-angle in the a-axis direction and the off-angle in the c-axis direction. Specifically, a large off-angle in the c-axis direction tends to weaken the effect of the off-angle in the a-axis direction (its effect of suppressing bright-spotted emission). More specifically, it is observed that, even in a case where the off-angles in the a- and c-axis directions are both larger than ±0.1 degrees, an off-angle in the c-axis direction larger than the off-angle in the a-axis direction tends to diminish the effect of the off-angle in the a-axis direction (its effect of suppressing bright-spotted emission). Here, the off-angle in the c-axis direction shows similar tendencies in the + and − directions. Thus, it is confirmed that a more preferred condition with regard to the relationship between the off-angles in the a- and c-axis directions is that the absolute value of the off-angle in the a-axis direction is greater than the absolute value of the off-angle in the c-axis direction. With this condition fulfilled, it is possible to obtain the effect of suppressing bright-spotted emission under a wider range of growth conditions. The fact that the effect of suppressing bright-spotted emission varies with the relationship between the off-angles in the a- and c-axis directions as described above is considered to result from the fact that the direction of migration of atoms varies as the off-angle in the c-axis direction increases.

Based on the above findings, it is confirmed that, with consideration given to surface morphology etc., a preferred off-angle in the a-axis direction is larger than 0.1 degrees but 10 degrees or smaller, and that a preferred off-angle in the c-axis direction is larger than ±0.1 degrees but smaller than ±10 degrees. It is also confirmed that it is preferable that the off-angle in the a-axis direction be larger than the off-angle in the c-axis direction because that makes it easier to obtain the effect of suppressing bright-spotted emission.

PRACTICAL EXAMPLES

As a nitride semiconductor laser chip of a practical example, a nitride semiconductor laser chip similar to the one according to the embodiment described above was fabricated by use of a GaN substrate having an off-angle of 1.7 degrees in the a-axis direction and an off-angle of +0.1 degrees in the c-axis direction relative to the m plane {1−100}. In other respects, this practical example was structured in the same manner as the embodiment described above. As a comparison example, another nitride semiconductor laser chip was fabricated in the same manner as the one according to the embodiment described above but by using a GaN substrate having no off-angle (an m-plane just substrate). In other respects, the nitride semiconductor laser chip of the comparison example was structured in the same manner as that of the practical example.

With the practical and comparison examples, the threshold current was measured. Whereas with the nitride semiconductor laser chip of the comparison example the value of the threshold current was about 100 mA, with the nitride semiconductor laser chip of the practical example the value of the threshold current was 65 mA; thus, it was confirmed that the threshold current was far lower with the nitride semiconductor laser chip of the practical example than with that of the comparison example. This is considered to result from the fact that suppressed bright-spotted emission leads to even light emission across the plane and hence a higher gain. Also with regard to the driving voltage, it was confirmed that the driving voltage as observed when a current of 50 mA was injected was about 0.35 V lower with the nitride semiconductor laser chip of the practical example than with that of the comparison example. This is considered to result from the fact that using as the principal growth plane of a GaN substrate a plane having an off-angle in the a-axis direction relative to the m plane changes how Mg is absorbed into the p-type semiconductor layers so as to enhance the activation rate. The emission wavelength of the nitride semiconductor laser chip of the practical example was 495 nm.

It should be understood that the embodiment disclosed herein is in every respect illustrative and not restrictive. The scope of the present invention is set out not in the description of the embodiment presented above but in the appended claims, and encompasses any variations and modifications within the sense and scope equivalent to those of the claims.

For example, although the above embodiment deals with examples in which the invention is applied to nitride semiconductor laser chips as one example of nitride semiconductor light-emitting chips, this is not meant to limit the invention; the invention may be applied to nitride semiconductor light-emitting diode chips.

Although the above embodiment deals with examples in which the off-angles in the a- and c-axis directions are each made larger than ±0.1 degrees, this is not meant to limit the invention; the off-angles in the a- and c-axis directions may be ±0.1 degrees or less. With consideration given to the effect of suppressing bright-spotted emission and to surface morphology, however, it is preferable that the off-angles in the a- and c-axis directions be each larger than ±0.1 degrees.

Although the above embodiment deals with examples in which the off-angle in the a-axis direction is 10 degrees or smaller, this is not meant to limit the invention; the off-angle in the a-axis direction may be 10 degrees or larger. Too large an off-angle in the a-axis direction, however, may degrade surface morphology, and therefore it is preferable that the off-angle in the a-axis direction be 10 degrees or smaller.

Figure 23:
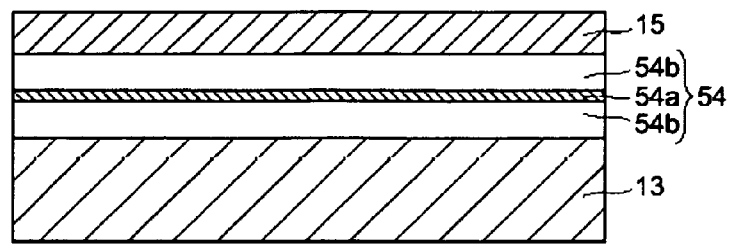
FIG. 23 is a sectional view showing an example of an active layer having an SQW structure.

Although the above embodiment deals with examples in which the quantum well structure of the active layer is a DQW structure, this is not meant to limit the invention; the active layer may be formed to have a quantum well structure other than a DQW structure. For example, the quantum well structure of the active layer may be an SQW (single quantum well) structure. Specifically, for example, as shown in FIG. 23, on the lower guide layer 13, it is possible to form an active layer 54 having an SQW structure which has one well layer 54a of InGaN and two barrier layers 54b of InGaN alternately stacked. The well layer 54a is given a thickness of, for example, about 3 nm to about 4 nm, and the barrier layers 54b are given a thickness of, for example, about 70 nm. In the structure according to the embodiment described above, giving the active layer an SQW structure helps reduce the driving voltage compared with giving it a DQW structure. Specifically, with an active layer having an SQW structure, the driving voltage as observed when a current of 50 mA is injected is about 0.1 V to 0.25 V lower than with an active layer having a DQW structure. This is considered to result possibly from the fact that, in a DQW structure, depletion of carriers in the barrier layer sandwiched between two well layers produces a strong electric field in the barrier layer. The active layer may be given, other than an SQW structure, an MQW structure. Also in cases where the active layer is given an SQW or MQW structure, it is possible to obtain the effect of suppressing bright-spotted emission.

Although the above embodiment deals with examples in which a GaN substrate is used as a nitride semiconductor substrate, this is not meant to limit the invention; a nitride semiconductor substrate other than a GaN substrate may be used. It is possible to use, for example, nitride semiconductor substrates of InGaN, AlGaN, AlGaInN, etc. With regard to the individual nitride semiconductor layers grown as a crystal on top of the substrate, their respective thicknesses, compositions, etc. may be differently combined or changed appropriately to suit the desired characteristics. For example, a semiconductor layer may be added or eliminated, or the order of semiconductor layers may be partly changed. The conductivity types of semiconductor layers may be partly changed. That is, any variations and modifications are possible so long as the basic characteristics of a nitride semiconductor laser chip are obtained.

Although the above embodiment deals with examples in which the In composition ratio in the well layers is 0.2 to 0.25, this is not meant to limit the invention; the In composition ratio in the well layers may be changed as necessary within the range of 0.15 or more but 0.45 or less. The In composition ratio in the well layers may be less than 0.15. The well layers may contain Al so long as its content is 5% or less.

Although the above embodiment deals with examples in which the In composition ratio in the barrier layers is 0.04 to 0.05, this is not meant to limit the invention; the In composition ratio in the barrier layers may be changed as necessary within the range less than the In composition ratio in the well layers.

Although the above embodiment deals with examples in which the barrier layers are formed of InGaN, this is not meant to limit the invention; the barrier layers may be formed of GaN. Forming the barrier layers out of GaN in this way helps suppress dislocations that develop in the direction parallel to the c-axis direction (and appear as dark lines in the EL emission pattern) when the In composition ratio in the well layers is increased. In a case where the barrier layers are formed of GaN, for effective light confinement, for example, the In composition ratio in the guide layers etc. is increased.

Although the above embodiment deals with examples in which the distance between the carrier block layer and the well layers is made equal to the thickness of the third barrier layer, it is also possible to form a plurality of nitride semiconductor layers of different compositions between the carrier block layer and the well layers (the most carrier block layer-side one of the well layers). Also preferable is to dope, to p-type, part of the interface between the carrier block layer and the well layers (the most carrier block layer-side one of the well layers) with a p-type dopant such as Mg. In the above embodiment, no such doping is done.

Although the above embodiment deals with examples in which the carrier block layer is given a thickness of 40 nm or less, this is not meant to limit the invention; the carrier block layer may be given a thickness more than 40 nm. Even when the carrier block layer contains about 3% of In, the effect of the present invention can be obtained. For the purpose of reducing the driving voltage, it is preferable that the Al composition ratio in the carrier block layer be more than the Al composition ratio in the upper clad layer.

Although the above embodiment deals with examples in which Si is used as the n-type dopant for the n-type semiconductor layers, this is not meant to limit the invention; as an n-type dopant other than Si, it is possible to use, for example, O, Cl, S, C, Ge, Zn, Cd, Mg, or Be. Particularly preferable n-type dopants are Si, O, and Cl.

Although the above embodiment deals with examples in which the insulating layer is formed of $SiO_2$, this is not meant to limit the invention; the insulating layer may be formed of an insulating material other than $SiO_2$. For example, the insulating layer may be formed of SiN, $Al_2O_3$, $ZrO_2$, or the like.

Although the above embodiment deals with examples in which the individual nitride semiconductor layers are grown as a crystal by an MOCVD process, this is not meant to limit the invention; the individual nitride semiconductor layers may be formed by any other epitaxial growth process other than an MOCVD process. Processes other than an MOCVD process include, for example, an HVPE (hydride vapor phase epitaxy) process, a gas source MBE (molecular beam epitaxy) process, etc.

What is claimed is:

1. A nitride semiconductor light-emitting chip comprising:
   a nitride semiconductor substrate having a principal growth plane; and a nitride semiconductor layer grown on the principal growth plane of the nitride semiconductor substrate, wherein the principal growth plane is a plane having off-angles in both a- and c-axis directions relative to an m plane, and the off-angle in the a-axis direction is larger than the off-angle in the c-axis direction.

2. The nitride semiconductor light-emitting chip according to claim 1, wherein the off-angle in the a-axis direction and the off-angle in the c-axis direction are each larger than 0.1 degrees.

3. The nitride semiconductor light-emitting chip according to claim 1, wherein the off-angle in the a-axis direction is larger than 0.1 degrees but 10 degrees or smaller.

4. The nitride semiconductor light-emitting chip according to claim 3, wherein the off-angle in the a-axis direction is larger than 1 degree but 10 degrees or smaller.

5. The nitride semiconductor light-emitting chip according to claim 1, wherein the nitride semiconductor layer includes an active layer having a quantum well structure, and the active layer has one well layer.

6. The nitride semiconductor light-emitting chip according to claim 1, wherein the nitride semiconductor layer includes an active layer having a quantum well structure, and the active layer has two well layers.

7. The nitride semiconductor light-emitting chip according to claim 1, wherein the nitride semiconductor layer includes an active layer having a quantum well structure, the active layer has a well layer formed of a nitride semiconductor containing In, and an In composition ratio in the well layer is 0.15 or more but 0.45 or less.

8. The nitride semiconductor light-emitting chip according to claim 1, wherein the nitride semiconductor substrate is formed of GaN.

9. A semiconductor optical device comprising:

the nitride semiconductor light-emitting chip according to claim 1; and a cap covering the nitride semiconductor light-emitting chip.

10. A method of manufacture of a nitride semiconductor light-emitting chip, the method comprising:

a step of preparing a nitride semiconductor substrate having as a principal growth plane a plane having off-angles in both a- and c-axis directions relative to an m plane, the off-angle in the a-axis direction being larger than the off-angle in the c-axis direction; and a step of stacking, on the principal growth plane of the nitride semiconductor substrate, by an epitaxial growth method, a nitride semiconductor layer including an n-type semiconductor layer, an active layer, and a p-type semiconductor layer, wherein the step of stacking the nitride semiconductor layer includes a step of forming, from a nitride semiconductor substrate side, the n-type semiconductor layer, the active layer, and the p-type semiconductor layer.

11. The method of manufacture of a nitride semiconductor light-emitting chip according to claim 10, wherein the step of stacking the nitride semiconductor layer includes a step of forming the p-type semiconductor layer at a growth temperature of 700° or higher but lower than 900° C.

12. The method of manufacture of a nitride semiconductor light-emitting chip according to claim 10, wherein the step of stacking the nitride semiconductor layer includes a step of forming the n-type semiconductor layer at a growth temperature of 900° or higher but lower than 1300° C.

13. The method of manufacture of a nitride semiconductor light-emitting chip according to claim 10, wherein the step of stacking the nitride semiconductor layer includes a step of forming the active layer at a growth temperature of 600° or higher but 770° C. or lower.

* * * * *